(12) United States Patent
Wano et al.

(10) Patent No.: US 8,633,559 B2
(45) Date of Patent: Jan. 21, 2014

(54) SOLID-STATE IMAGING DEVICE, METHOD OF MANUFACTURING THE SAME, AND ELECTRONIC APPARATUS

(75) Inventors: Hiromi Wano, Kanagawa (JP); Yoshiaki Kitano, Kanagawa (JP)

(73) Assignee: Sony Corporation (JP)

( * ) Notice: Subject to any disclaimer, the term of this patent is extended or adjusted under 35 U.S.C. 154(b) by 575 days.

(21) Appl. No.: 12/567,180

(22) Filed: Sep. 25, 2009

(65) Prior Publication Data

US 2010/0078744 A1   Apr. 1, 2010

(30) Foreign Application Priority Data

Sep. 29, 2008 (JP) ................................ 2008-251669

(51) Int. Cl.
*H01L 27/146* (2006.01)

(52) U.S. Cl.
USPC .................................. 257/435; 257/E21.127

(58) Field of Classification Search
USPC .................................. 257/432–435, E21.127
See application file for complete search history.

(56) References Cited

U.S. PATENT DOCUMENTS

2007/0275496 A1* 11/2007 Yamashita et al. ............... 438/57
2008/0265353 A1* 10/2008 Komoguchi et al. ......... 257/432

FOREIGN PATENT DOCUMENTS

| JP | 2000-150845 | 5/2000 |
| JP | 2003-324189 | 11/2003 |
| JP | 2004-221532 | 8/2004 |
| JP | 2005-294749 | 10/2005 |
| JP | 2006-086320 | 3/2006 |

* cited by examiner

*Primary Examiner* — Matthew Reames
(74) *Attorney, Agent, or Firm* — Sheridan Ross P.C.

(57) ABSTRACT

A solid-state imaging device includes light-sensing sections serving as pixels, and waveguides each including a core layer and a cladding layer, the waveguides each being disposed at a position corresponding to one of the light-sensing sections. A cross-sectional structure of the waveguide taken in the horizontal direction of an imaging plane is different from a cross-sectional structure of the waveguide taken in the vertical direction of the imaging plane.

15 Claims, 37 Drawing Sheets

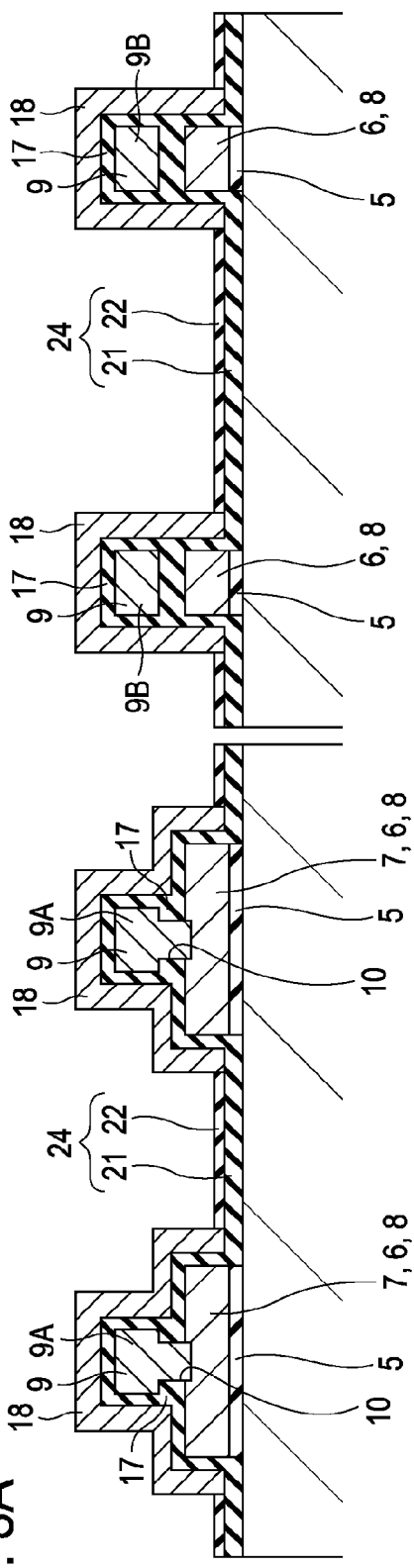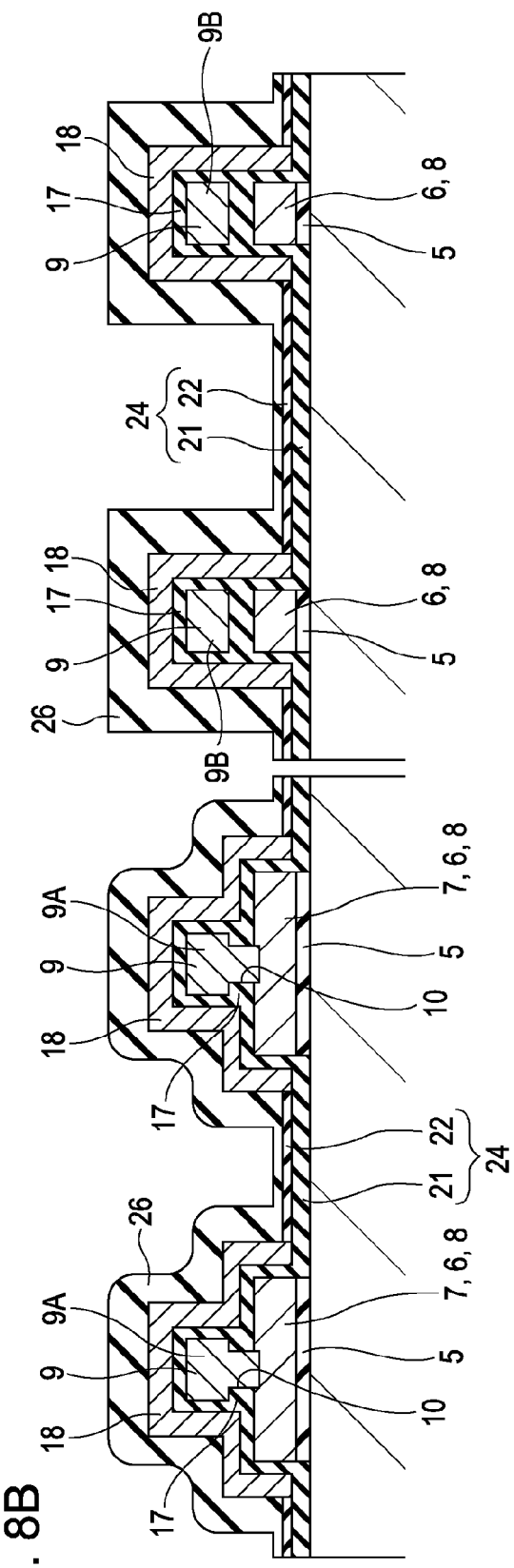

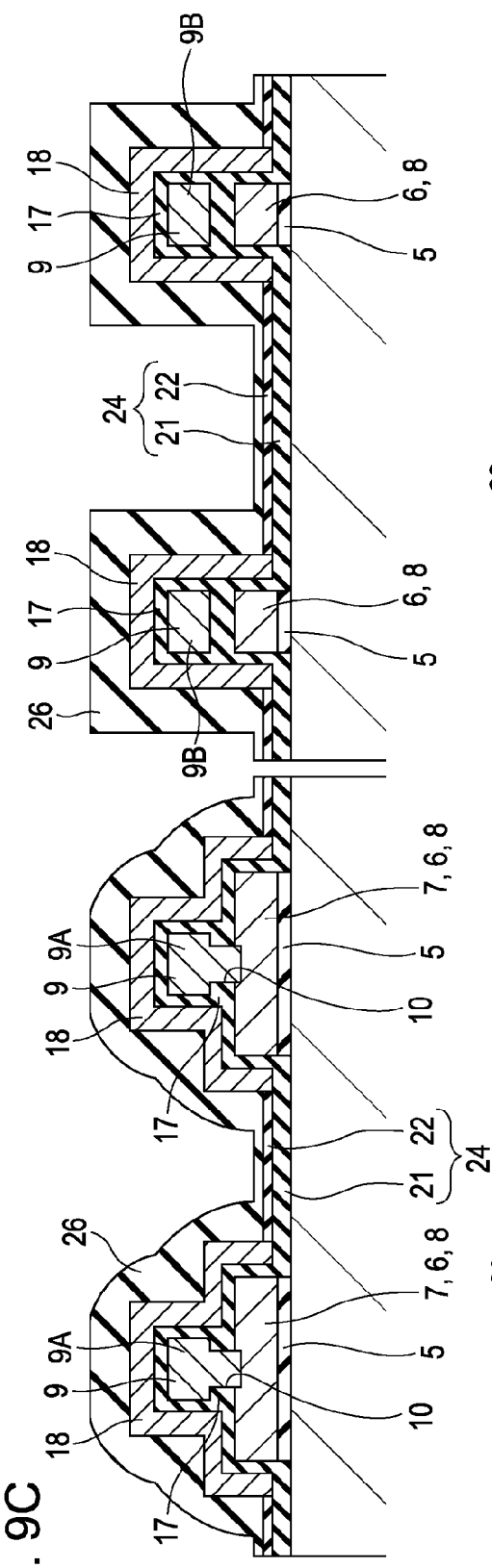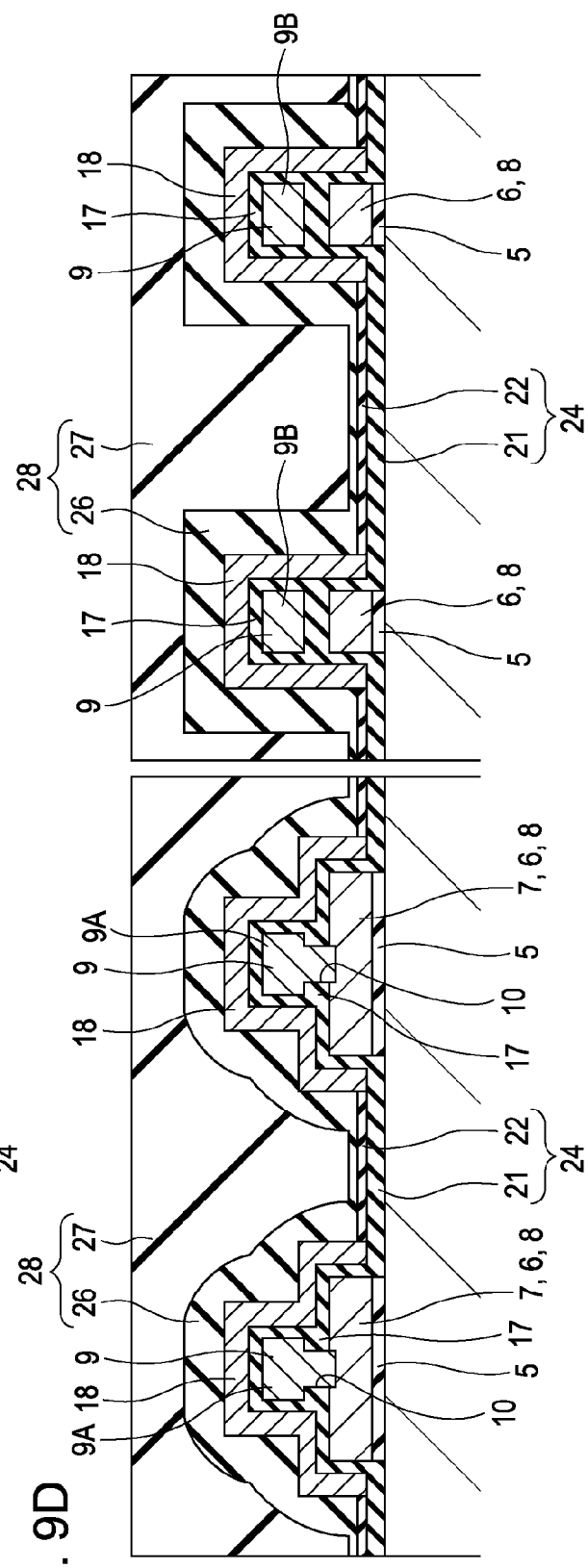

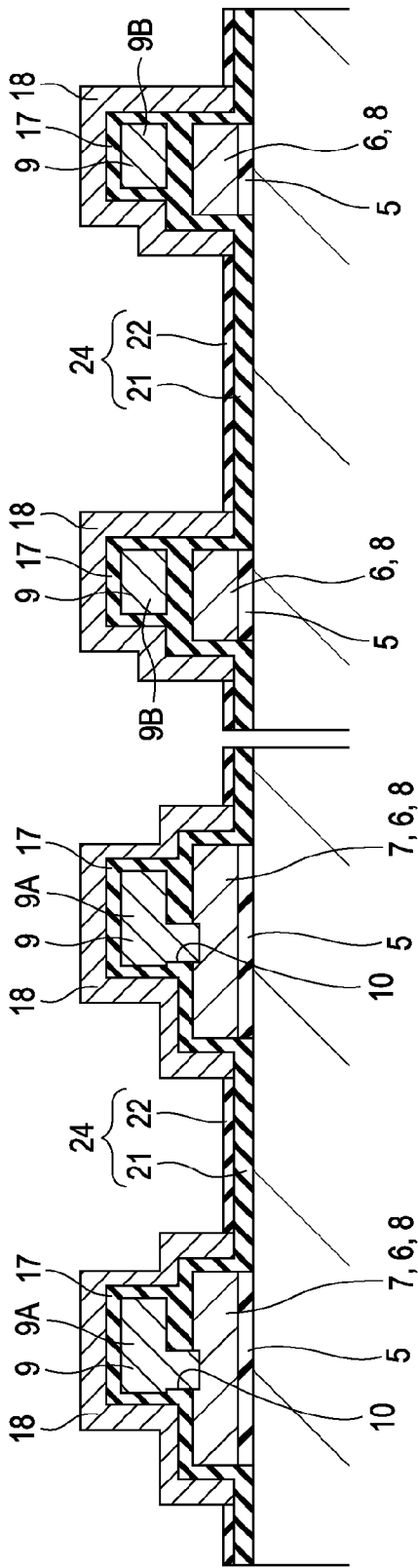
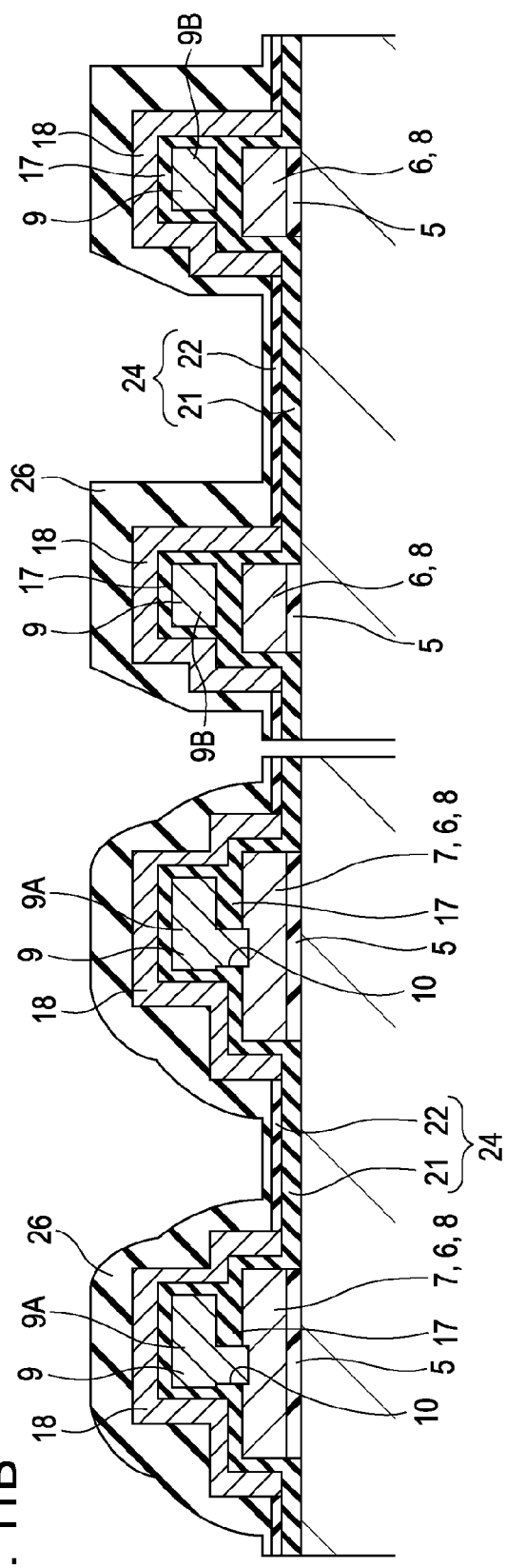
FIG. 11A
FIG. 11B

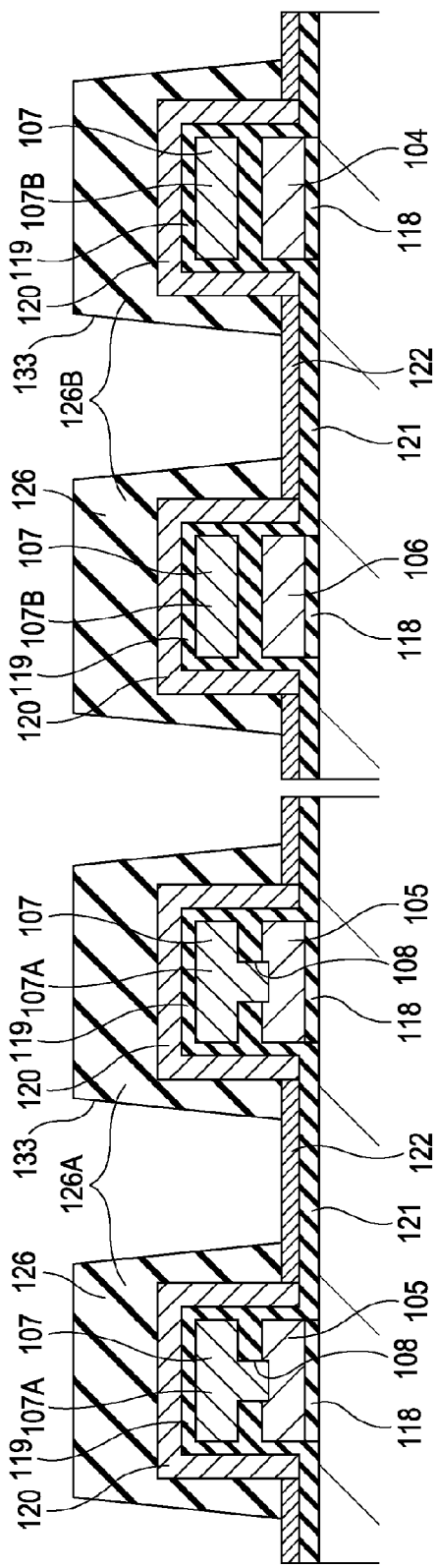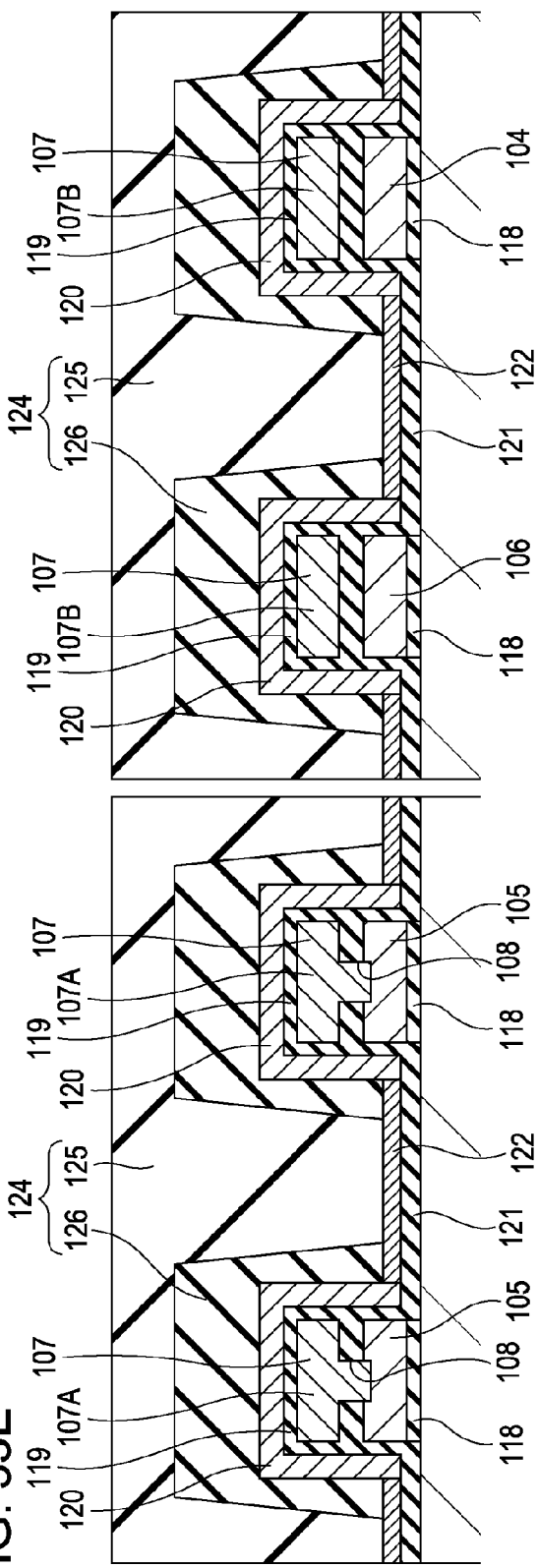

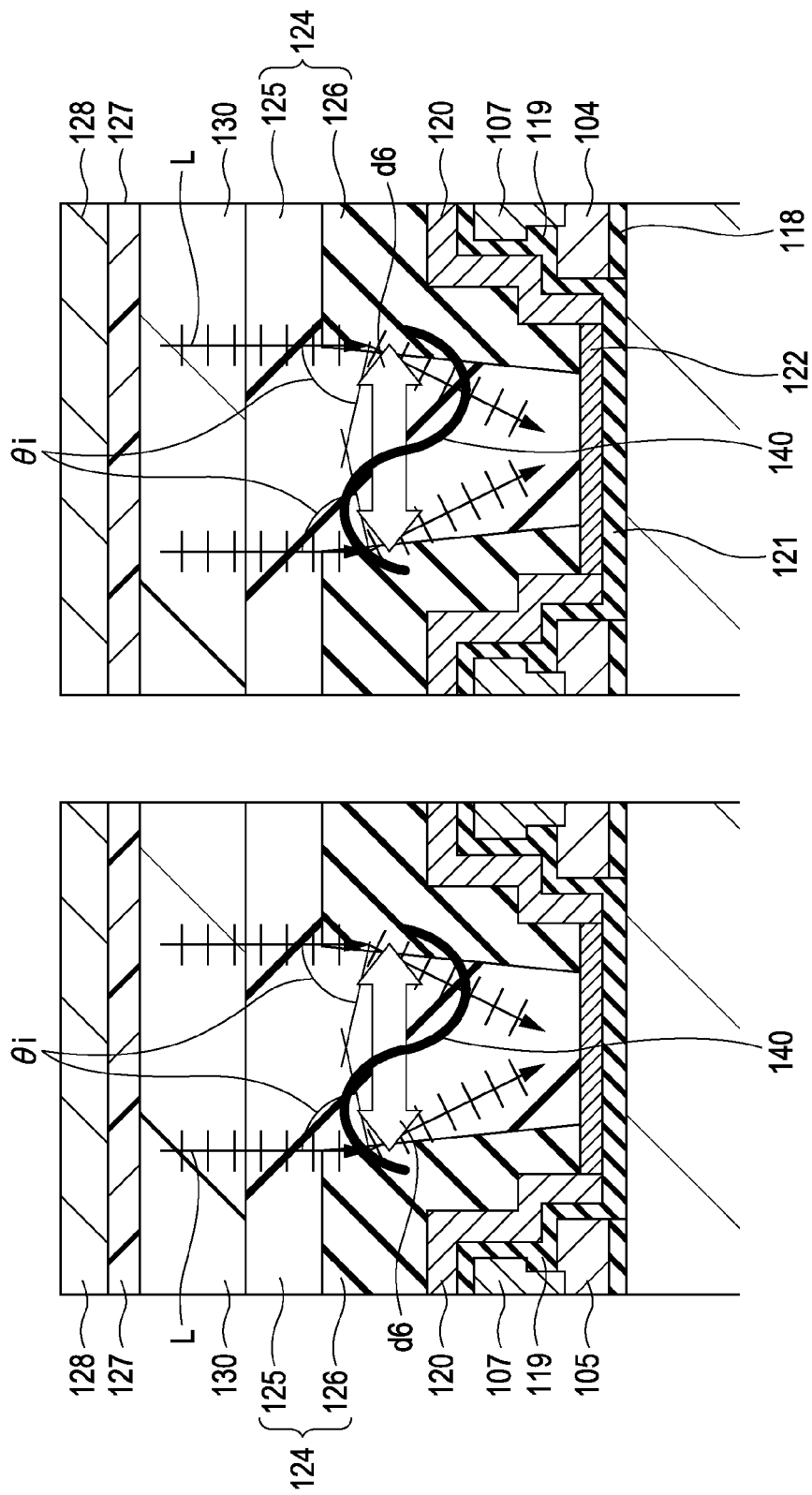

SOLID-STATE IMAGING DEVICE, METHOD OF MANUFACTURING THE SAME, AND ELECTRONIC APPARATUS

BACKGROUND OF THE INVENTION

1. Field of the Invention

The present invention relates to a solid-state imaging device, a method of manufacturing the same, and an electronic apparatus including the solid-state imaging device.

2. Description of the Related Art

Solid-state imaging devices are classified roughly into charge transfer solid-state imaging devices typified by a charge-coupled device (CCD) image sensor and amplification type solid-state imaging devices typified by a complementary metal oxide semiconductor (CMOS) image sensor.

Typically, a CCD solid-state imaging device has an imaging region including a plurality of light-sensing sections, i.e., photodiodes serving as photoelectric conversion elements, which are two-dimensionally arrayed, and a vertical transfer register section which has a CCD structure and which is disposed for each column of photodiodes. The CCD solid-state imaging device further includes a horizontal transfer register section which has a CCD structure and which transfers signal charges from the imaging region in the horizontal direction, an output section, peripheral circuits constituting a signal processing circuit, etc.

Typically, a CMOS solid-state imaging device has an imaging region in which a plurality of pixels, each including a photodiode serving as a photoelectric conversion element constituting a light-sensing section and a plurality of pixel transistors (MOS transistors), are two-dimensionally arrayed, and a peripheral circuit section which is disposed in the periphery of the imaging region and which performs signal processing, etc.

Concerning these solid-state imaging devices, with the miniaturization of pixels, in order to improve the light collection efficiency of incident light, a structure having a waveguide for each photodiode has been proposed, the waveguide including a cladding layer and a core layer having different refractive indices. Solid-state imaging devices having a waveguide function are disclosed, for example, in Japanese Unexamined Patent Application Publication Nos. 2000-150845, 2003-324189, 2004-221532, 2005-294749, and 2006-86320, etc.

FIGS. 27 to 29 show an example of a CCD solid-state imaging device according to the related art. FIG. 27 is a plan view showing a main portion of an imaging region, FIG. 28 is a cross-sectional view taken along the line XXVIII-XXVIII of FIG. 27, and FIG. 29 is a cross-sectional view taken along the line XXIX-XXIX of FIG. 27. Referring to FIG. 27, in a CCD solid-state imaging device 100, generally, square photodiodes (PDs) constituting light-sensing sections 101 are two-dimensionally arrayed, and a vertical transfer register section 102 which has a CCD structure and which transfers signal charges in the vertical direction is disposed for each column of light-sensing sections. The vertical transfer register section 102 includes a buried transfer channel region 103 and a plurality of transfer electrodes disposed thereon with a gate insulating film therebetween. In this example, three transfer electrodes (transfer electrodes 104, 105, and 106) are disposed so as to correspond to one photodiode (PD) constituting a light-sensing section 101, the transfer electrodes 104, 105, and 106 being composed of a first-layer polysilicon film.

The transfer electrodes 104 and 106 are respectively continuously formed so as to extend in the horizontal direction along the space between the vertically adjacent light-sensing sections 101 such that the corresponding electrodes in the vertical transfer register sections 102 are connected to one another. In the meantime, the transfer electrodes 105 which also serve as readout electrodes are independently formed like islands, and thus, are connected to connecting conductive layers 107 composed of a second-layer polysilicon film. The connecting conductive layers 107 have strip portions 107B disposed on the transfer electrodes 104 and 106, which extend between the vertically adjacent light-sensing sections 101, with an insulating film therebetween, and extending portions 107A integrated with the strip portions 107B and extending over the transfer electrodes 105. The extending portions 107A are connected to contact portions 108 of the transfer electrodes 105 in the corresponding vertical transfer register sections 102.

As shown in the cross-sectional views of FIGS. 28 and 29, on a first conductivity type (e.g., n-type) semiconductor substrate 111, a first semiconductor well region 112 of a second conductivity type (p-type) is disposed, and photodiodes (PDs) constituting light-sensing sections 101 are disposed in the p-type first semiconductor well region 112. Each photodiode (PD) includes an n-type semiconductor region 113 and a p-type semiconductor region 114 which suppresses dark current. Furthermore, n-type buried transfer channel regions 115 and p+ channel stop regions 116 are disposed in the p-type first semiconductor well region 112. A p-type second semiconductor well region 117 is disposed directly under each buried transfer channel region 115.

Transfer electrodes 104 to 106 composed of a first-layer polysilicon film are disposed on the buried transfer channel regions 115 with a gate insulating film 118 therebetween, and connecting conductive layers 107 composed of a second-layer polysilicon film, which are connected to the island-like transfer electrodes 105 through an insulating film 119, are disposed. A light-shielding film 120 is disposed so as to cover, excluding the photodiodes (PDs), the transfer electrodes 104 to 106 and the connecting conductive layers 107 with the insulating film 119 therebetween. An insulating film 121, for example, composed of a silicon oxide film, and an antireflection film 122, for example, composed of a silicon nitride film, are disposed on the surfaces of the photodiodes (PDs) not provided with the light-shielding film 120.

A waveguide 124 is disposed above each photodiode (PD) so that incident light can be effectively collected onto the photodiode (PD). The waveguide 124 includes a core layer 125 having a high refractive index, for example, composed of a silicon nitride film, and a cladding layer 126 surrounding the core layer 125 and having a low refractive index, for example, composed of a silicon oxide film.

An on-chip color filter 128 is disposed further thereon with a passivation film 130 and a planarizing film 127 on the passivation film 130 therebetween, and on-chip microlenses 129 are disposed on the on-chip color filter 128.

The transfer electrode 105 and the connecting conductive layer 107 can have the same width as shown in FIG. 30, or the width of the connecting conductive layer 107 can be set smaller than the width of the transfer electrode 105 as shown in FIG. 31. In either case, the transfer electrode 105 and the connecting conductive layer 107 are formed symmetrically with respect to the axis O.

FIGS. 32A to 32C and FIGS. 33D and 33E show steps in a method of manufacturing a solid-state imaging device 100 according to the related art, in particular, a process of fabricating a waveguide. In each drawing, the left portion corresponds to a cross-section taken along the line XXVIII-XXVIII of FIG. 27 (in the horizontal direction), and the right portion corresponds to a cross-section taken along the line XXIX-XXIX of FIG. 27 (in the vertical direction).

First, as shown in FIG. 32A, transfer electrodes 104 to 106 are formed, with a gate insulating film 118 therebetween, on a semiconductor substrate 111 in which photodiodes (PDs), buried transfer channel regions 115, channel stop regions 116, etc. have been formed. Furthermore, connecting conductive layers 107, some of which are connected to the transfer electrodes 104, are formed thereon with an insulating film 119 therebetween, and a light-shielding film 120 is formed thereon with the insulating film 119 therebetween. To simplify the drawings, the buried transfer channel regions 115, the channel stop regions, etc. are omitted therefrom.

Next, as shown in FIG. 32B, a cladding material film 126A (composed of a low-refractive-index material) for forming a cladding layer of waveguides is formed over the entire surface of the light-shielding film 120 and the inside of the openings corresponding to the photodiodes 101. The cladding material film 126A can be formed, for example, using silicon oxide ($SiO_2$), such as the one formed by heat-treating borophosphosilicate glass (BPSG), followed by reflowing. At this time, as shown in FIG. 32B, the BPSG layer is formed with a large thickness. Then, the surface of the BPSG layer is planarized, for example, using chemical mechanical polishing (CMP), dry etching, or the like.

Next, as shown in FIG. 32C, a resist mask 132 having openings 132a at positions corresponding to the photodiodes 101 is formed on the cladding material film 126A using a lithographic technique.

Next, as shown in FIG. 33D, the cladding material film 126A is dry-etched using the resist mask 132, thereby to form recesses 133 which extend to an antireflection film 122. Thereby, a cladding layer 126 composed of the cladding material film 126A is formed on the inner walls of the recesses 133.

Next, as shown in FIG. 33E, by embedding a material (high-refractive-index material) having a higher refractive index than the cladding layer 126 in the recesses 133, a core layer 125 is formed. The core layer 125 is also formed on surfaces other than the recesses 133. In such a manner, waveguides 124 each including the core layer 125 and the cladding layer 126 are formed.

SUMMARY OF THE INVENTION

In solid-state imaging devices, in particular, in CCD solid-state imaging devices, with a decrease in the pixel cell size, it has become difficult to maintain optical properties, such as sensitivity and an anti-smear property. In order to cope with such a situation, as described above, a waveguide structure has been proposed, in which interfaces between layers having different refractive indices are placed in the vicinity of the Si interfaces of the photodiodes (PDs), light energy is concentrated on the higher refractive index side, and thus, light is made to enter the Si interfaces.

However, in the case where a waveguide is formed by the method shown in FIGS. 32A to 33E, since the planar shape of the waveguide is substantially square, the waveguide structure has symmetry. That is, (1) the width or shape of the core layer of the waveguide is the same at the positions located at the same height from the surface of the substrate both in the cross-section taken along the line XXVIII-XXVIII (in the horizontal direction) and in the cross-section taken along the line XXIX-XXIX (in the vertical direction); (2) the taper angle at the interface between the cladding layer and the core layer in the cross-section taken along the line XXVIII-XXVIII (in the horizontal direction) is the same as that in the cross-section taken along the line XXIX-XXIX (in the vertical direction), and in each cross-section, the inclination angles on the right and left sides are symmetrical; and (3) the cross-sectional shape of the waveguide taken along the line XXVIII-XXVIII (in the horizontal direction) is the same as the cross-sectional shape of the waveguide taken along the line XXIX-XXIX (in the vertical direction).

Furthermore, it is difficult to form waveguides by self-alignment with respect to the transfer electrodes and the connecting conductive layers, and it is necessary to control the process margin, such as the misalignment of the mask.

In the waveguide having the highly symmetrical structure at positions located at a certain height from the surface of the substrate both in the cross-section taken along the line XXVIII-XXVIII (in the horizontal direction) and in the cross-section taken along the line XXIX-XXIX (in the vertical direction) as described above, the following problem easily occurs. That is, in the waveguide, incoming light and light totally reflected with phases shifted with respect to each other easily interfere with each other, standing waves are easily generated, and phases of light incident on the photodiode (PD) are easily aligned.

FIGS. 34A and 34B show such a state. FIG. 34A is a cross-sectional view taken in the horizontal direction, and FIG. 34B is a cross-sectional view taken in the vertical direction. When the taper angle of the interface between the two layers having different refractive indices in the waveguide is uniform and the core width d6 at the same height is uniform in the horizontal and vertical directions, the incident angle θi of incident light L to the interface in the waveguide is the same at each side. The phases of incident light L totally reflected are aligned, and standing waves 140 are easily generated. FIG. 35 is a top view of a waveguide 124 including a core layer 125 and a cladding layer 126. Since the shape of the waveguide 124 is substantially square, at the same height, as shown by arrows, core widths in the longitudinal and lateral directions are the same, and core widths in two diagonal directions are the same. Thus, the core widths are symmetrical.

In a state where the phases of light are easily aligned, peaks and valleys of the waveform due to interference easily appear in spectral characteristics, and the spectral ripple significantly deteriorates. Furthermore, since peaks and valleys of the waveform in spectral characteristics clearly appear under the influence of interference, even a slight variation in the thickness of the core layer may vary the spectral characteristics. The thickness of the core layer varies due to polishing variations, etch-back variations, etc. after the formation of the core layer.

FIG. 37 shows spectral characteristics of CCD solid-state imaging devices having waveguides according to the related art, and this example shows spectral characteristics in the red wavelength range on the assumption of a variation in the thickness of the core layer. FIGS. 36A to 36E show samples (solid-state imaging devices) including a core layer with different thicknesses. FIG. 36C shows a sample including a core layer 125 having a standard thickness t1. FIG. 36A shows a sample including a core layer 125 having a thickness of 100 nm smaller than the standard thickness t1 (=t1−100 nm). FIG. 36B shows a sample including a core layer 125 having a thickness of 50 nm smaller than the standard thickness t1 (=t1−50 nm). FIG. 36D shows a sample including a core layer 125 having a thickness of 50 nm larger than the standard thickness t1 (=t1+50 nm). FIG. 36E shows a sample including a core layer 125 having a thickness of 100 nm larger than the standard thickness t1 (=t1+100 nm).

In the spectral characteristics shown in FIG. 37, the curve c1 represents the characteristics in the case where the core layer has the standard thickness t1; the curve a1 represents the characteristics in the case where the core layer has a thickness of 100 nm smaller than the standard thickness t1 (=t1−100 nm); the curve b1 represents the characteristics in the case where the core layer has a thickness of 50 nm smaller than the standard thickness t1 (=t1−50 nm); the curve d1 represents the characteristics in the case where the core layer has a thickness of 50 nm larger than the standard thickness t1 (=t1+50 nm); and the curve e1 represents the characteristics in the case where the core layer has a thickness of 100 nm larger than the standard thickness t1 (=t1+100 nm).

As is evident from the spectral characteristics shown in FIG. 37, when the spectral ripple deteriorates and the thickness of the core layer 125 varies, a variation in spectral characteristics is observed. In the case where such spectral characteristics are exhibited, the variation in light-receiving sensitivity at a certain wavelength also increases. For example, at a wavelength of 620 nm, the sensitivity varies in a range of 0.44 to 0.62 (arbitrary units).

In CMOS solid-state imaging devices having a waveguide structure, similar spectral ripples occur, resulting in the same problem.

As described above, in the waveguide structure which is highly symmetrical in the planar direction, the phases of light easily align in the planar direction, resulting in the occurrence of spectral ripples. Therefore, imaging characteristics are adversely affected.

Furthermore, in a digital camera, when photographs are taken under a fluorescent lamp (bright line wavelengths: 440 nm/550 nm/620 nm), white balance is adjusted on the basis of the three wavelengths. When spectral ripples occur as described above, sensitivity at bright line wavelengths of a fluorescent lamp largely varies for each chip. As a result, it is necessary to set white balance for each chip, thus significantly decreasing productivity.

It is desirable to provide a solid-state imaging device in which imaging characteristics are improved by suppressing the occurrence of spectral ripples and a method of manufacturing the solid-state imaging device.

It is also desirable to provide an electronic apparatus including a camera or the like which is configured to have such a solid-state imaging device.

A solid-state imaging device according to an embodiment of the present invention includes light-sensing sections serving as pixels, and waveguides each including a core layer and a cladding layer, each of the waveguides being disposed at a position corresponding to one of the light-sensing sections, in which a cross-sectional structure of the waveguide taken in the horizontal direction of an imaging plane is different from a cross-sectional structure of the waveguide taken in the vertical direction of the imaging plane.

In the solid-state imaging device according to the embodiment of the present invention, since the cross-sectional structure of the waveguide taken in the horizontal direction of the imaging plane is different from the cross-sectional structure of the waveguide taken in the vertical direction of the imaging plane, the taper angle of the interface between the core layer and the cladding layer in the horizontal direction is different from that in the vertical direction, and the core width at the same height from the surface of the substrate in the horizontal direction is different from that in the vertical direction. Consequently, the phases of light totally reflected are not easily aligned, and standing waves are not easily generated.

A method of manufacturing a solid-state imaging device according to another embodiment of the present invention includes the steps of forming a cladding layer so as to follow a layered structure, the layered structure being formed such that a cross-sectional shape of each of openings corresponding to light-sensing sections in the horizontal direction of an imaging plane is different from a cross-sectional shape of each of the openings corresponding to the light-sensing sections in the vertical direction of the imaging plane; shaping the cladding layer; and embedding a core layer in the openings corresponding to the light-sensing sections.

In the method of manufacturing a solid-state imaging device according to the other embodiment of the present invention, a layered structure is formed such that a cross-sectional shape of each of openings corresponding to light-sensing sections in the horizontal direction of an imaging plane is different from that in the vertical direction. Then, a cladding layer is formed so as to follow the layered structure, and a core layer is embedded. Consequently, waveguides are formed, in each of which the taper angle of the interface between the core layer and the cladding layer in the horizontal direction is different from that in the vertical direction, and the core width at the same height in the horizontal direction is different from that in the vertical direction. Since the cladding layer is formed so as to follow the layered structure, the waveguides can be formed by self-alignment.

An electronic apparatus according to another embodiment of the present invention includes a solid-state imaging device, an optical system which guides incident light to photoelectric conversion elements of the solid-state imaging device, and a signal processing circuit which processes output signals of the solid-state imaging device. The solid-state imaging device includes light-sensing sections serving as pixels, and waveguides each including a core layer and a cladding layer, each of the waveguides being disposed at a position corresponding to one of the light-sensing sections, in which a cross-sectional structure of the waveguide taken in the horizontal direction of an imaging plane is different from a cross-sectional structure of the waveguide taken in the vertical direction of the imaging plane.

In the electronic apparatus according to the other embodiment of the present invention, in the solid-state imaging device, since the cross-sectional structure of the waveguide taken in the horizontal direction of the imaging plane is different from the cross-sectional structure of the waveguide taken in the vertical direction of the imaging plane, the taper angle of the interface between the core layer and the cladding layer in the horizontal direction is different from that in the vertical direction, and the core width at the same height from the surface of the substrate in the horizontal direction is different from that in the vertical direction. Consequently, the phases of light totally reflected are not easily aligned, and standing waves are not easily generated.

In the solid-state imaging device according to the embodiment of the present invention, since standing waves are not easily generated in the waveguides, the occurrence of spectral ripples can be suppressed, and imaging characteristics can be improved.

In the method of manufacturing a solid-state imaging device according to the other embodiment of the present invention, it is possible to manufacture a solid-state imaging device in which the occurrence of spectral ripples is suppressed and imaging characteristics are improved.

In the electronic apparatus according to the other embodiment of the present invention, since the occurrence of spectral ripples is suppressed and imaging characteristics are improved in the solid-state imaging device, quality improvement can be achieved.

BRIEF DESCRIPTION OF THE DRAWINGS

FIGS. 8A and 8B show steps in a method of manufacturing a solid-state imaging device according to the first embodiment;

FIGS. 9C and 9D show steps subsequent to the step shown in FIG. 8B in the method of manufacturing a solid-state imaging device according to the first embodiment;

FIGS. 11A and 11B show steps in a method of manufacturing a solid-state imaging device according to the second embodiment;

FIGS. 33D and 33E show steps subsequent to the step shown in FIG. 32C in the method of manufacturing a solid-state imaging device according to the related art;

FIGS. 34A and 34B are cross-sectional views for explaining the reason for generation of standing waves;

DESCRIPTION OF THE PREFERRED EMBODIMENTS

The embodiments of the present invention will be described below with reference to the drawings. The description will be made in the following order:

1. First embodiment (example of structure of solid-state imaging device and example of manufacturing method thereof)

2. Second embodiment (example of structure of solid-state imaging device and example of manufacturing method thereof)

3. Third embodiment (example of structure of solid-state imaging device and example of manufacturing method thereof)

4. Fourth embodiment (example of structure of solid-state imaging device)

5. Fifth embodiment (example of structure of solid-state imaging device)

6. Sixth embodiment (example of structure of solid-state imaging device)

7. Seventh embodiment (example of structure of solid-state imaging device)

8. Eighth embodiment (example of structure of solid-state imaging device)

9. Ninth embodiment (example of structure of solid-state imaging device)

10. Tenth embodiment (example of structure of solid-state imaging device)

11. Eleventh embodiment (example of structure of solid-state imaging device)

12. Twelfth embodiment (example of structure of solid-state imaging device)

13. Thirteenth embodiment (example of structure of electronic apparatus)

1. First Embodiment (Example of Structure of Solid-state Imaging Device)

Figure 1:
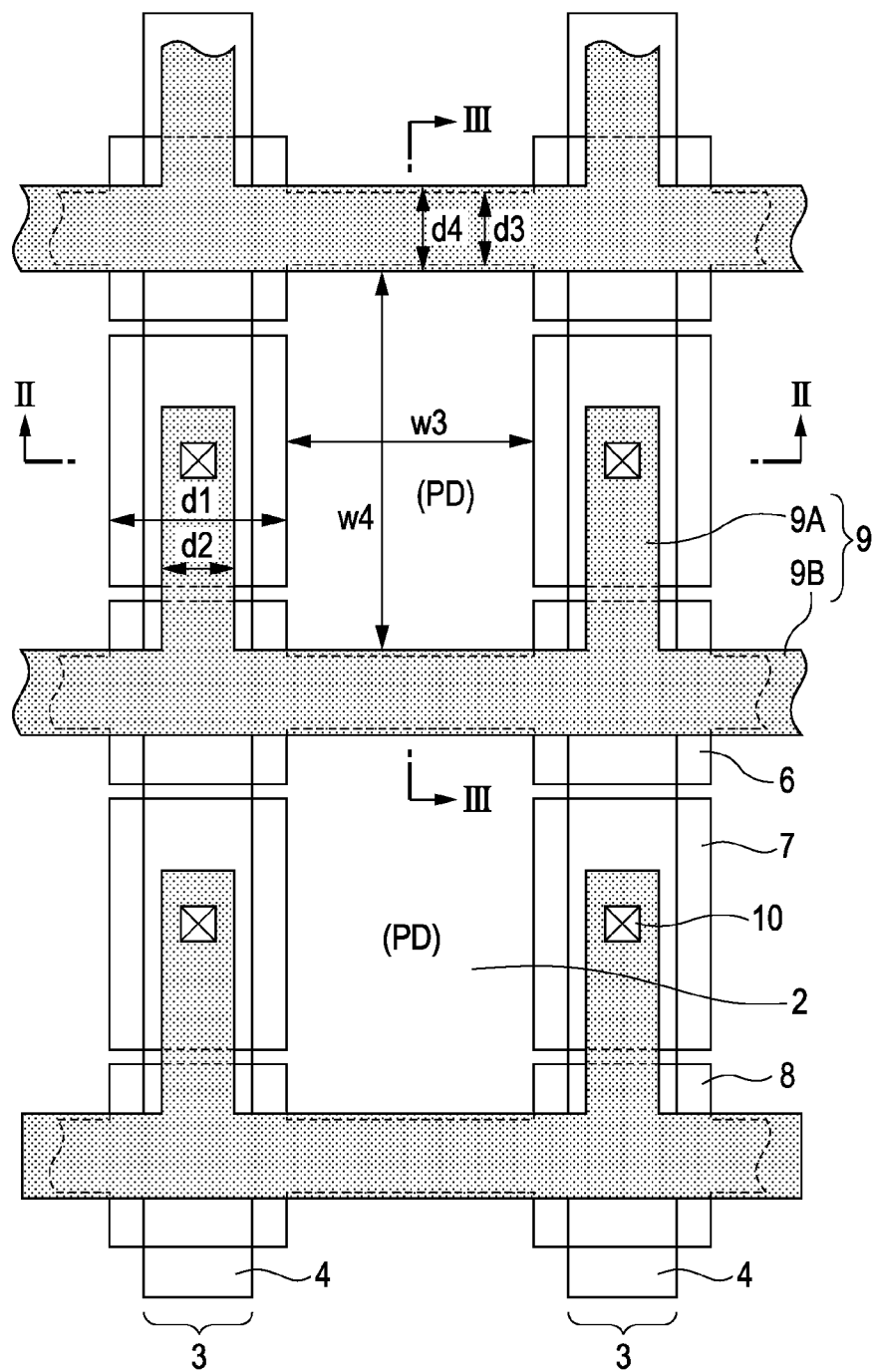
FIG. 1 is a plan view showing a main portion of a solid-state imaging device according to a first embodiment of the present invention.
Figure 2:
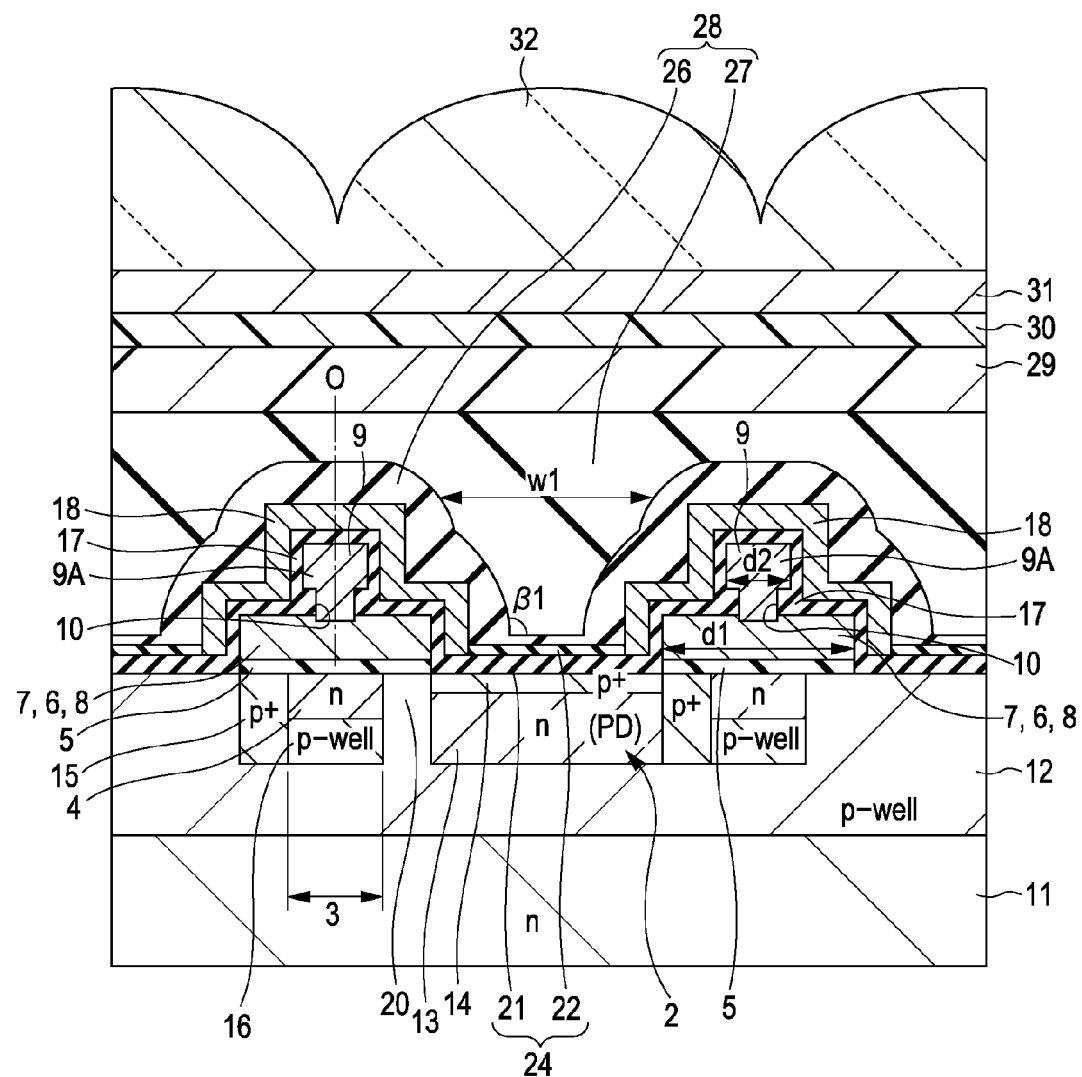
FIG. 2 is a cross-sectional view taken along the line II-II of FIG. 1.
Figure 3:
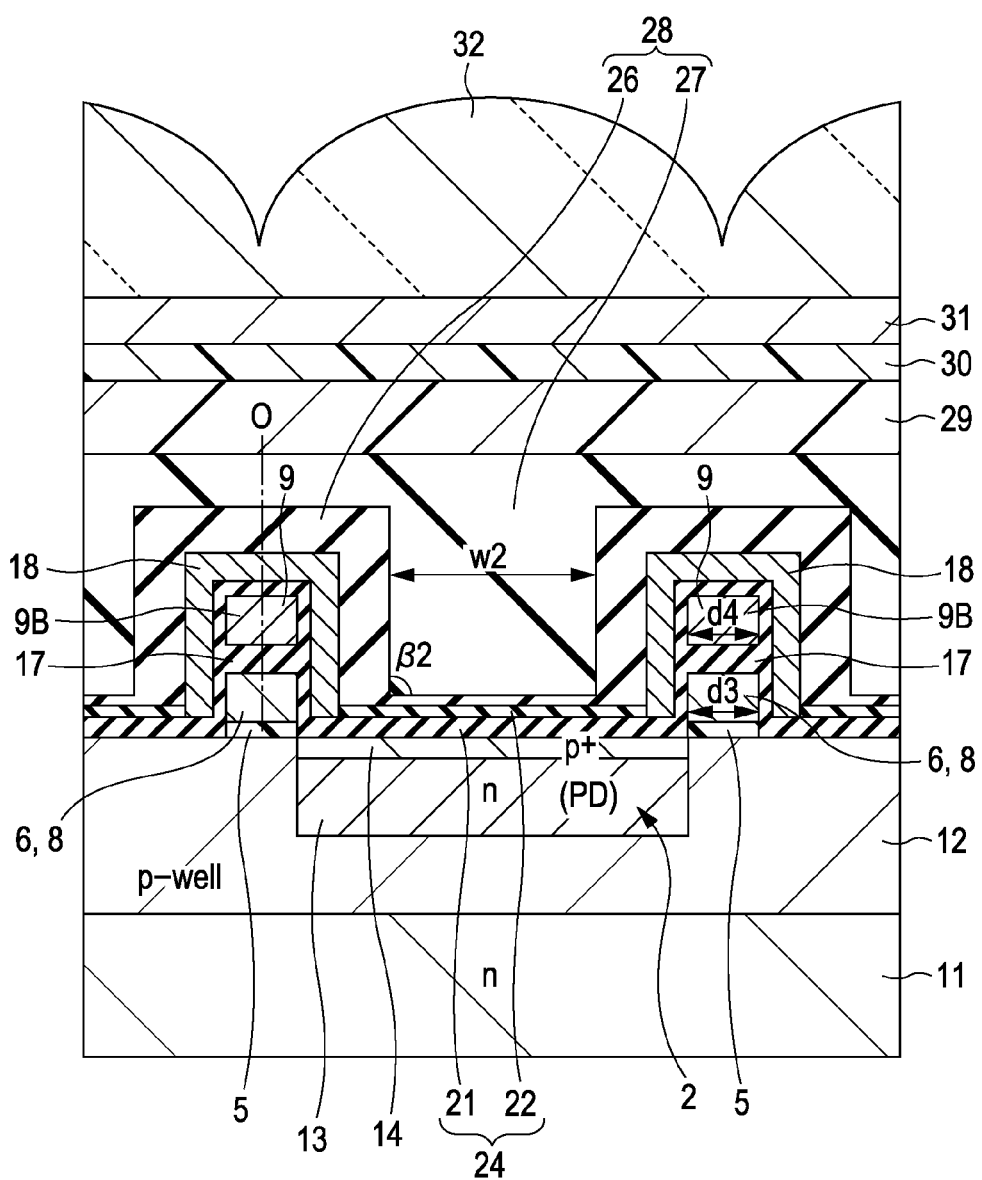
FIG. 3 is a cross-sectional view taken along the line III-III of FIG. 1.

FIGS. 1 to 3 show an example of a solid-state imaging device according to a first embodiment of the present invention, which is applied to a CCD solid-state imaging device. FIG. 1 is a plan view showing a main portion of an imaging region of a CCD solid-state imaging device, FIG. 2 is a cross-sectional view taken along the line II-II of FIG. 1, and FIG. 3 is a cross-sectional view taken along the line III-III of FIG. 1.

Referring to FIG. 1, a solid-state imaging device 1 according to the first embodiment has an imaging region including rectangular light-sensing sections 2 which are two-dimensionally arrayed and a vertical transfer register section 3 which has a CCD structure and which is disposed for each column of light-sensing sections 2. Each of the light-sensing sections 2 has a rectangular shape in which w4>w3, where w4 is an opening width in the longitudinal direction, and w3 is an opening width in the lateral direction. The light-sensing section 2 includes a photodiode (PD) serving as a photoelectric conversion element and has its long sides in the vertical direction and short sides in the horizontal direction. The vertical transfer register section 3 is configured to transfer signal charges read out from the light-sensing sections 2 sequentially in the vertical direction. The vertical transfer register section 3 includes a buried transfer channel region (hereinafter referred to as a "transfer channel region") 4 and a plurality of transfer electrodes (6, 7, and 8) disposed thereon in the transfer direction with a gate insulating film therebetween. The transfer electrodes 6, 7, and 8 are composed of a first-layer polysilicon film. In this example, three transfer electrodes (transfer electrodes 6, 7, and 8) are disposed so as to correspond to one light-sensing section 2.

Among the transfer electrodes, the transfer electrodes 6 and 8 are respectively continuously formed so as to extend in the horizontal direction along the space between the vertically adjacent light-sensing sections 2 such that the corresponding electrodes in the vertical transfer register sections 3 are connected to one another. In the meantime, the transfer electrodes 7 which also serve as readout electrodes, each of which is sandwiched between transfer electrodes 6 and 8, are independently formed like islands in each vertical transfer register section 3, and thus, are connected to connecting conductive layers 9 composed of a second-layer polysilicon film. The connecting conductive layers 9 have strip portions 9B disposed on the transfer electrodes 6 and 8, which extend between the vertically adjacent light-sensing sections 2, with an insulating film therebetween, and extending portions 9A integrated with the strip portions 9B and extending over the island-like transfer electrodes 7. The extending portions 9A of the connecting conductive layers 9 are connected to contact portions 10 of the transfer electrodes 7 in the corresponding vertical transfer register sections 3.

As shown in the cross-sectional views of FIGS. 2 and 3, on a first conductivity type (e.g., n-type) semiconductor substrate 11, a first semiconductor well region 12 of a second conductivity type (p-type) is disposed, and photodiodes (PDs) constituting light-sensing sections 2 are disposed in the p-type first semiconductor well region 12. Each photodiode (PD) includes an n-type semiconductor region 13 and a p+ semiconductor region 14 which suppresses dark current on the surface. Furthermore, n-type transfer channel regions 4 and p+ channel stop regions 15 are disposed in the p-type first semiconductor well region 12. A p-type second semiconductor well region 16 is disposed directly under each n-type transfer channel region 4.

Transfer electrodes 6 to 8 composed of a first-layer polysilicon film are disposed on the n-type transfer channel regions 4 with a gate insulating film 5 therebetween, and connecting conductive layers 9 composed of a second-layer polysilicon film are disposed thereon with an insulating film 17 therebetween. Extending portions 9A of the connecting conductive layers 9 are connected to contact portions 10 of the island-like transfer electrodes 7 through contact holes of the insulating film 17. The transfer electrodes 6 to 8 are each disposed so as to extend over the p+ channel stop region 15, the transfer channel region 4, and a region from the transfer channel region to the edge of the light-sensing section 2. That is, the transfer electrodes 7 extend to readout regions 20 which extend from the transfer channel regions to the edges of the light-sensing sections 2. A light-shielding film 18 is disposed so as to cover, excluding the light-sensing sections 2, the transfer electrodes 6 to 8 and the connecting conductive layers 9. A laminated insulating film 24, for example, including a silicon oxide (SiO$_2$) film 21 and a silicon nitride (SiN) film 22, is disposed on the surfaces of the light-sensing sections 2 and functions as an antireflection layer at the interface with the silicon substrate, thus preventing sensitivity from decreasing.

A waveguide 28 according to the embodiment of the present invention, which will be described later, is disposed above each light-sensing section 2 so that incident light can be effectively collected onto the light-sensing section 2. The waveguide 28 includes a cladding layer composed of a material having a low refractive index and a core layer composed of a material having a high refractive index. An on-chip color filter 31 is disposed further thereon with a passivation film 29 and a planarizing film 30 therebetween, and on-chip microlenses 32 are disposed on the on-chip color filter 31. The passivation film 29 is, for example, composed of silicon nitride (SiN or SiON). The planarizing film 30 is an organic coating film of an acrylic resin or the like.

The waveguide 28 includes a cladding layer 26 which is formed so as to follow the surface of a layered structure including the transfer electrodes 6 to 8, the connecting conductive layers 9, the light-shielding film 18, etc. and a core layer 27 which is embedded in a recess surrounded by the cladding layer 26. The cladding layer 26 is composed of a material having low refractive index, such as a silicon oxide film, and the core layer 27 is composed of a material having a high refractive index, such as a silicon nitride film or a silicon oxynitride film. The refractive index n1 of the core layer 27 to be embedded is preferably in a range of 1.60 to 2.20. The refractive index n2 of the cladding layer 26 is preferably in a range of 1.00 to 1.59. The cladding layer 26 is preferably formed so as to remain with a predetermined thickness on the insulating 24 on the light-sensing section 2. In the case where a structure is employed in which the cladding layer does not remain on the light-sensing section and the core layer 27 and the insulating film 24 are in contact with each other, it is not possible to obtain the antireflection effect of the insulating film 24 at the Si interface, thus impairing the sensitivity characteristic. Since the cladding layer 26 remains on the insulating film 24, the antireflection effect of the insulating film 24 is maintained.

In this embodiment, a cross-sectional structure of the waveguide 28 taken in the horizontal direction of an imaging plane (cross-section taken along the line II-II) is different from a cross-sectional structure of the waveguide 28 taken in the vertical direction of the imaging plane (cross-section taken along the line III-III). That is, in this embodiment, on the vertical transfer register section 3, the width d2 of the extending portion 9A of the connecting conductive layer 9 composed of the second-layer polysilicon film is set smaller than the width d1 of each of the transfer electrodes 6 to 8 composed of the first-layer polysilicon film (d1>d2). In the meantime, on the space between the vertically adjacent light-sensing sections 2, the width d3 of each of the transfer electrodes 6 and 8 composed of the first-layer polysilicon film is set substantially the same as the width d4 of the strip portion 9B of the connecting conductive layer 9 composed of the second-layer polysilicon film (d3=d4). In the cross-section taken in the horizontal direction (cross-section taken along the line II-II), referring to FIG. 2, a laminate including any one of the transfer electrodes 6 to 8 and the connecting conductive layer 9 is formed symmetrically with respect to the axis O. In the cross-section taken in the vertical direction (cross-section taken along the line III-III), referring to FIG. 3, a laminate including the transfer electrode 6 or 8 and the connecting conductive layer 9 is also formed symmetrically with respect the axis O. The cross-sectional structure including any of the transfer electrodes 6 to 8 and the connecting conductive layer 9 in the vertical transfer register section 3 is different from the cross-sectional structure including the transfer electrode 6 or 8 and the connecting conductive layer 9 located between the vertically adjacent light-sensing sections 2 (pixels).

In such a configuration of the transfer electrodes and the connecting conductive layers, when comparison is made at the same height in the waveguiding direction of the waveguide 28, i.e., in the depth direction of the waveguide, the width w1 of the core layer 27 in the horizontal direction (in the cross-section taken along the line II-II) is different from the width w2 of the core layer 27 in the vertical direction (in the cross-section taken along the line III-III). That is, the width of the core layer 27 in the waveguide 28 in the horizontal direction of the imaging plane is different from that in the vertical direction of the imaging plane at the same height from the surface of the substrate. Furthermore, with respect to the interface between the core layer 27 and the cladding layer 26, the inclination angle β1 of the interface in the horizontal direction (in the cross-section taken along the line II-II) is different from the inclination angle β2 of the interface in the vertical direction (in the cross-section taken along the line III-III). In this example, the inclination angle β2 is substantially 90 degrees (substantially vertical). Consequently, the waveguide 28 is formed such that the cross-sectional shape in the horizontal direction is different from the cross-sectional shape in the vertical direction. In the waveguide 28, each of the inclination angle β1 in the horizontal direction and the inclination angle β2 in the vertical direction is symmetrical with respect to the axis in the waveguiding direction.

In FIG. 3, when the width of the strip portion 9B of the connecting conductive layer 9 is set smaller than the width of the transfer electrode 6 or 8, the inclination angles β1 and β2 can be considered as taper angles. In such a case, the taper angle in the waveguiding direction of the interface of the waveguide 28 in the horizontal direction (in the cross-section taken along the line II-II) is different from that in the vertical direction (in the cross-section taken along the line III-III).

In the solid-state imaging device 1 according to the first embodiment, the cross-sectional structure of the waveguide 28 taken in the horizontal direction of the imaging plane is different from the cross-sectional structure of the waveguide 28 taken in the vertical direction of the imaging plane. That is, when compared at the same height in the waveguiding direction, the width w1 of the core layer 27 in the horizontal direction of the imaging plane is different from the width w2 of the core layer 27 in the vertical direction. Furthermore, when compared the inclination angle in the waveguiding direction of the interface between the cladding layer and the core layer, the inclination angle β1 in the horizontal cross-section is different from the inclination angle β2 in the vertical cross-section. Because of such a waveguide structure, the phases of light totally reflected at the waveguide are not easily aligned, standing waves are not easily generated, and the occurrence of spectral ripples is suppressed. Therefore, the imaging characteristics of the solid-state imaging device 1 are improved.

Figure 4:
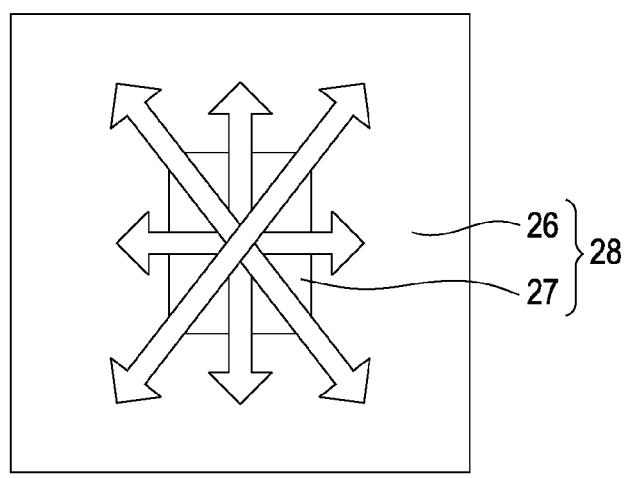
FIG. 4 is a plan view of a waveguide used for describing the first embodiment.

FIG. 4 is a schematic top view of a waveguide 28 according to the first embodiment, in which core widths at a given height are indicated by arrows. The core width in the horizontal direction is different from the core width in the vertical direction. Furthermore, the inclination angle (or taper angle) of the interface between the layers having different refractive indices in the horizontal direction is greatly different from that in the vertical direction. Core widths in two diagonal directions are the same. At the same height, the core width in the horizontal direction is different from that in the vertical direction, and the inclination angle (or taper angle) in the horizontal direction is different from that in the vertical direction. Consequently, the phases of light are not easily aligned, and spectral ripples do not easily occur.

Figure 5:
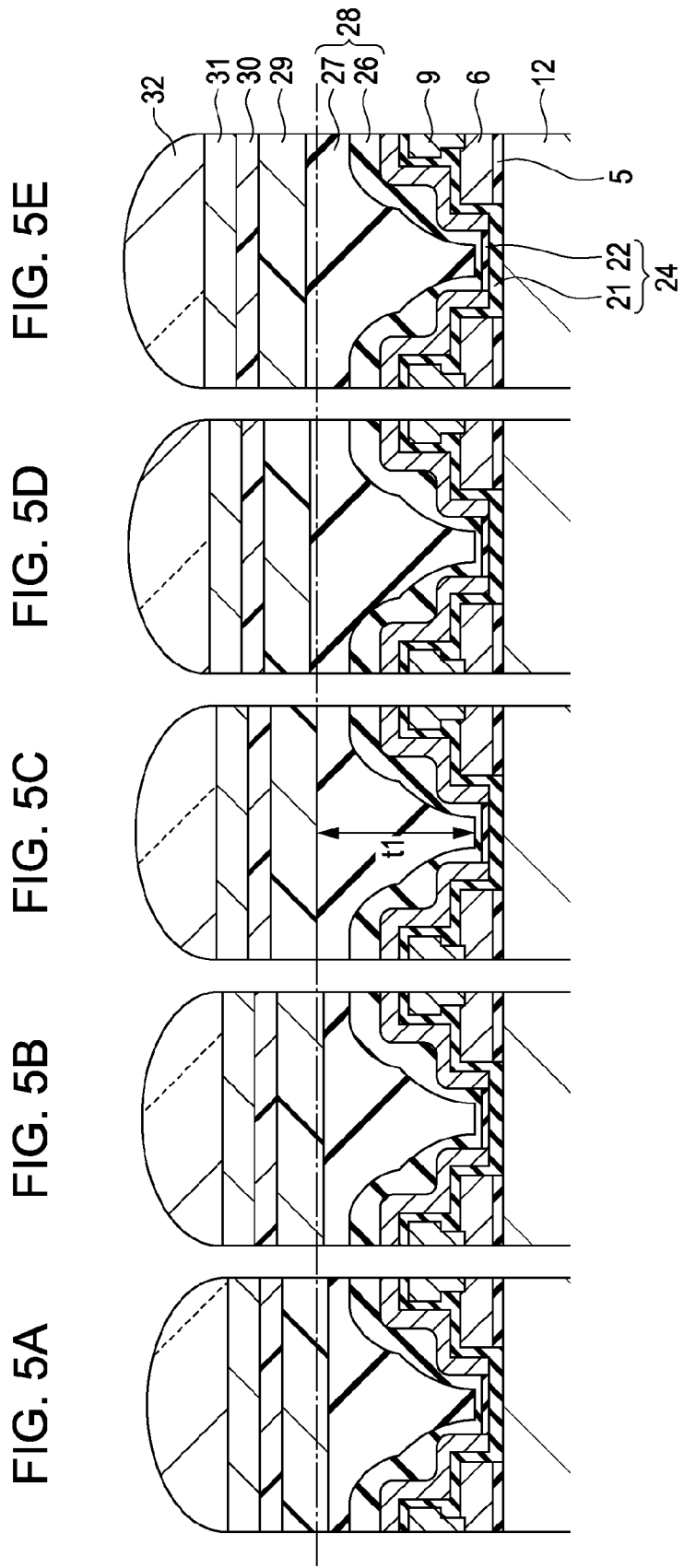
FIGS. 5A to 5E show samples for measuring spectral characteristics of solid-state imaging devices according to the first embodiment.
Figure 6:
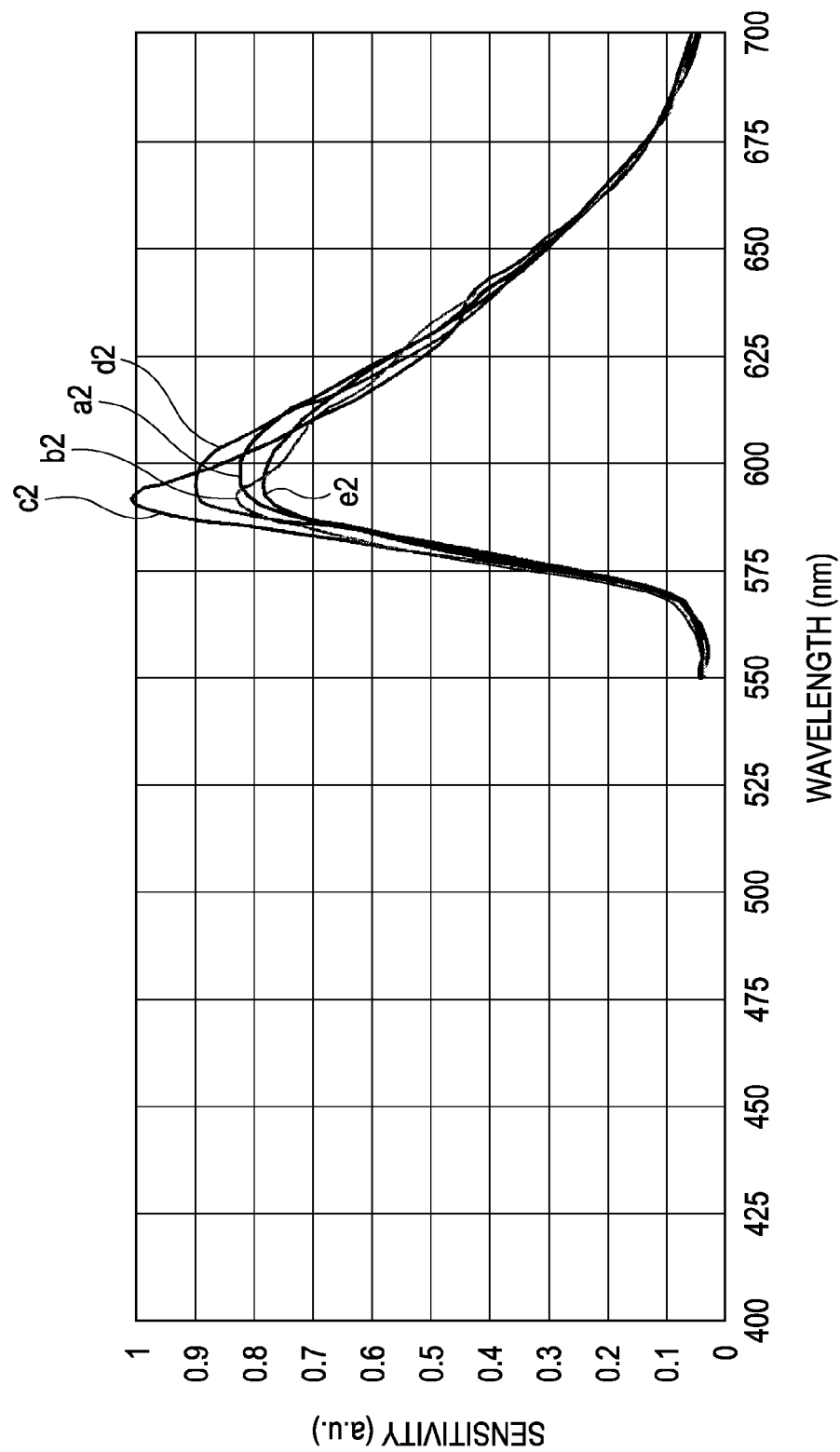
FIG. 6 is a graph showing spectral characteristics of solid-state imaging devices according to the first embodiment.

FIG. 6 shows spectral characteristics of solid-state imaging devices 1 each having a waveguide 28 according to the first embodiment, and this example shows spectral characteristics in the red wavelength range with the thickness of the core layer as a parameter. FIGS. 5A to 5E show samples (solid-state imaging devices) including a core layer with different thicknesses. FIG. 5C shows a sample including a core layer 27 having a standard thickness t1. FIG. 5A shows a sample including a core layer 27 having a thickness of 100 nm smaller than the standard thickness t1 (=t1−100 nm). FIG. 5B shows a sample including a core layer 27 having a thickness of 50 nm smaller than the standard thickness t1 (=t1−50 nm). FIG. 5D shows a sample including a core layer 27 having a thickness of 50 nm larger than the standard thickness t1 (=t1+50 nm). FIG. 5E shows a sample including a core layer 27 having a thickness of 100 nm larger than the standard thickness t1 (=t1+100 nm).

In the spectral characteristics shown in FIG. 6, the curve c2 represents the characteristics of the sample shown in FIG. 5C in which the core layer 27 has the standard thickness t1; the curve a2 represents the characteristics of the sample shown in FIG. 5A in which the core layer 27 has a thickness of 100 nm smaller than the standard thickness t1; the curve b2 represents the characteristics of the sample shown in FIG. 5B in which the core layer 27 has a thickness of 50 nm smaller than the standard thickness t1; the curve d2 represents the characteristics of the sample shown in FIG. 5D in which the core layer 27 has a thickness of 50 nm larger than the standard thickness t1; and the curve e2 represents the characteristics of the sample shown in FIG. 5E in which the core layer 27 has a thickness of 100 nm larger than the standard thickness t1.

Figure 37:
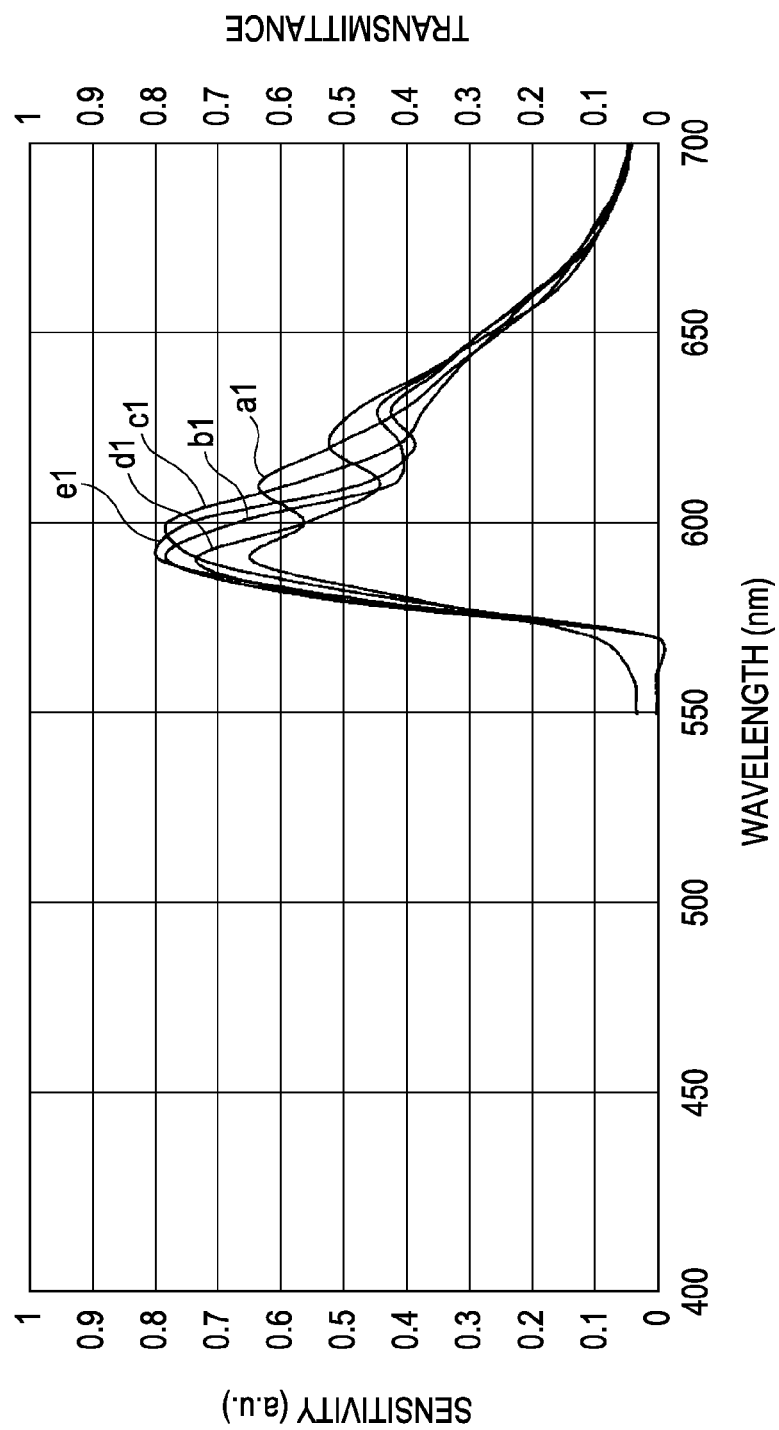
FIG. 37 is a graph showing spectral characteristics of solid-state imaging devices according to the related art.

As is evident from the spectral characteristics shown in FIG. 6, the spectral ripples are reduced compared with the example of the related art (spectral characteristics shown in FIG. 37).

Although the measurement results in the red wavelength range in which the wavelength is long and ripples easily occur has been shown as an example, spectral ripples also occur in spectral characteristics in the green and blue wavelength ranges, and such spectral ripples can also be suppressed according to the embodiment of the present invention.

Figure 7:
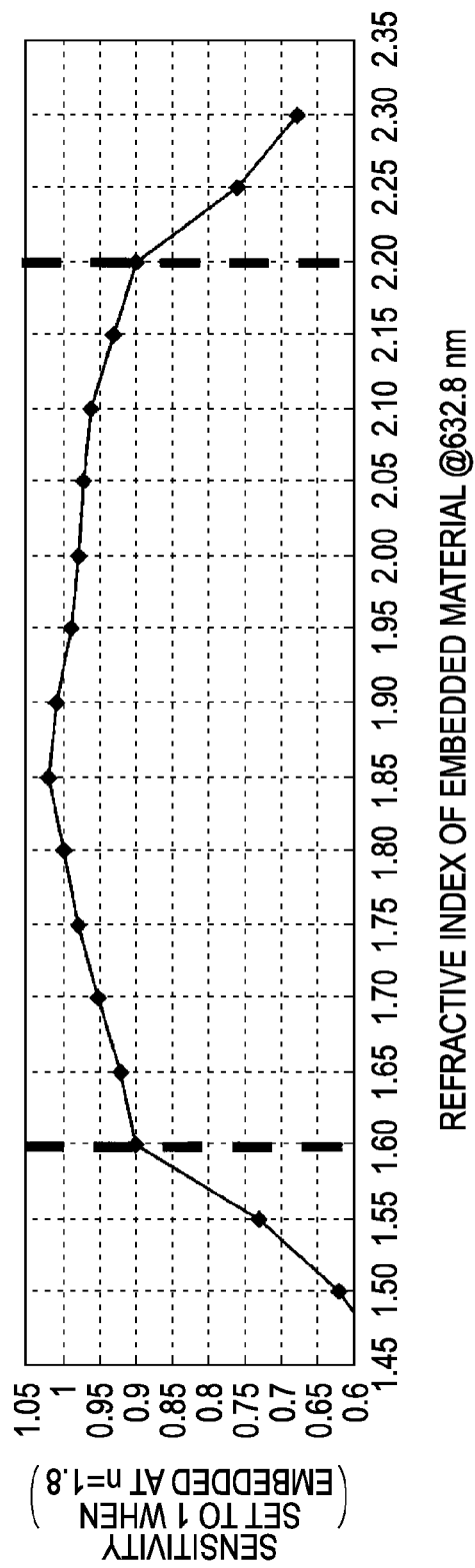
FIG. 7 is a graph showing a relationship between the refractive index of the core layer and sensitivity in solid-state imaging devices according to the first embodiment.

In this embodiment, as the material for the core layer 27 (i.e., embedded core material), preferably, a material having a refractive index n of 1.60 to 2.20 is used. In such a case, a high sensitivity characteristic can be obtained. FIG. 7 is a graph showing a relationship between the refractive index of the core material and sensitivity to parallel light. In the graph of FIG. 7, the vertical axis represents sensitivity, and the sensitivity is set to "1" when a core material having a refractive index n of 1.8 is used. The horizontal axis represents the refractive index of the core material (@632.8 nm).

As is evident from the sensitivity characteristic shown in FIG. 7, when a core material having a refractive index n in the range of 1.60 to 2.20 is used, high sensitivity is obtained. When the refractive index is out of this range, the sensitivity declines quickly.

(Example of Manufacturing Method of Solid-state Imaging Device)

FIGS. 8A and 8B and FIGS. 9C and 9D show steps in a method of manufacturing a solid-state imaging device according to the first embodiment, in particular, a process of fabricating a waveguide. In each drawing, the left portion corresponds to a cross-section taken along the line II-II of FIG. 1 (in the horizontal direction), and the right portion corresponds to a cross-section taken along the line III-III of FIG. 1 (in the vertical direction).

First, as shown in FIG. 8A, transfer electrodes 6, 7, and 8 each composed of a first-layer polysilicon film are formed repeatedly on a semiconductor substrate 11 with a gate insulating film 5 therebetween. In the semiconductor substrate 11, although some of them are not shown, photodiodes (PDs) constituting light-sensing sections 2, transfer channel regions 4, p+ channel stop regions 15, etc. have been formed. Furthermore, connecting conductive layers 9 (9A and 9B) composed of a second-layer polysilicon film are formed thereon with an insulating film 17 therebetween, extending portions 9A being connected to the transfer electrodes 7.

In each vertical transfer register section 3, the transfer electrodes 6 to 8 composed of a first-layer polysilicon film are formed with a width d1, the extending portions 9A of the connecting conductive layers 9 composed of a second-layer polysilicon film are formed with a width d2 which is smaller than the width d1. In the space between the vertically adjacent light-sensing sections 2, the transfer electrode 6 or 8 composed of the first-layer polysilicon film is formed with a width d3, and the strip portion 9B of the connecting conductive layer 9 composed of the second-layer polysilicon film is formed with a width d4 that is the same as the width d3 (d3=d4). In the vertical transfer register section 3, the layered structure including the transfer electrode 6, 7, or 8, the extending portion 9A of the connecting conductive layer 9, and a light-shielding film 18 is symmetrical with respect to the axis O in the horizontal cross-section. Similarly, in the space between the vertically adjacent light-sensing sections 2, the layered structure including the transfer electrode 6 or 8, the strip portion 9B of the connecting conductive layer 9, and the light-shielding film 18 is symmetrical with respect to the axis O in the vertical cross-section. Furthermore, each light-sensing section 2 is formed in a vertically long rectangular shape when viewed from above. That is, the shape of the layered electrode including the transfer electrode and the connecting conductive layer in the horizontal direction is different from that in the vertical direction, and the width w3 of the opening corresponding to the light-sensing section 2 in the horizontal direction is different from the width (w4) of the opening corresponding to the light-sensing section 2 in the vertical direction.

The light-shielding film 18, for example, composed of an Al film is formed further thereon with an insulating film 17 therebetween. The transfer channel region 4, the gate insulating film 5, and the transfer electrodes 6 to 8 constitute the vertical transfer register section 3. The insulating film 24 including a plurality of layers described above is formed on the surface of each light-sensing section 2.

Next, as shown in FIG. 8B, a cladding layer 26 is formed so as to follow the surface of the layered structure surrounding the recesses corresponding to the light-sensing sections 2. The cladding material for forming the cladding layer 26 may be, for example, a non-doped silicate glass (NSG) film formed by thermal chemical vapor deposition (CVD), a borophosphosilicate glass (BPSG) film, a phosphosilicate glass (PSG) film, or a plasma silicon oxide ($SiO_2$) film formed by plasma CVD. For example, in the case of a BPSG film, by forming the BPSG film with a thickness that is smaller than that in the related example, the BPSG film can be formed so as to follow the surface of the layered structure.

Next, as necessary, as shown in FIG. 9C, the cladding layer 26 may be shaped such that side wall surfaces (inclined and vertical surfaces) are smoothened and the cladding layer 26 remains with a predetermined thickness on the surfaces corresponding to the light-sensing sections 2. The shape control can be performed, for example, by dry etching, reflowing by heat treatment, or the like.

Next, as shown in FIG. 9D, a core layer 27 is formed so as to be embedded in recesses in the cladding layer 26 corresponding to the light-sensing sections 2. The core material for forming the core layer 27 has a higher refractive index than the cladding material, and for example, a silicon nitride (SiN) film or a silicon oxynitride (SiON) film can be used. The silicon nitride film and the silicon oxynitride film can be formed by CVD. In addition, as the core material for the core layer 27, for example, an organic film can also be used. Examples of the material for the organic film that can be used for the core layer 27 include resins having a high refractive index, such as a polyimide resin. In such a manner, a waveguide 28 including the cladding layer 26 and the core layer 27 according to this embodiment is formed in each light-sensing section 2.

In the subsequent steps, as in the usual manner, a passivation film, a planarizing film, an on-chip color filter, and on-chip microlenses are formed, thereby to obtain an intended solid-state imaging device 1.

In the method of manufacturing a solid-state imaging device according to this embodiment, in the step shown in FIG. 8A, the transfer electrodes 6 to 8 and the connecting conductive layers 9 are formed such that the shape of the electrode in the horizontal direction is different from that in the vertical direction, and the opening width of the recess on each light-sensing section 2 in the horizontal direction is different from that in the vertical direction. Consequently, it is possible to form the waveguides 28 in which the cross-sectional structure in the horizontal direction of the imaging plane is different from that in the vertical direction. Thus, it is possible to manufacture a solid-state imaging device in which standing waves are not easily generated in the waveguides 28, and spectral ripples are suppressed. Furthermore, in the step shown in FIG. 8B, the cladding layer 26 is formed so as to follow the inner surface of the recess for each light-sensing section 2, namely, the cladding layer 26 is formed so as to follow the surface of the layered structure including the transfer electrodes 6 to 8, the connecting conductive layers 9, and the light-shielding film 18. Because of this step, the waveguide 28 can be formed by self-alignment.

Furthermore, if necessary, in the step shown in FIG. 9C, the formed cladding layer 26 can be shaped. This applies to the case where, in the step shown in FIG. 8B, the thickness of the cladding layer 26 remaining in the light-sensing section is larger than the desired thickness and it is necessary to decrease the thickness or the case where the cladding layer 26 is formed on the side walls with a thickness larger than the desired thickness.

Furthermore, by allowing the cladding layer 26 to remain in the light-sensing section, it is possible to maintain the antireflection effect of the insulating film 24 at the Si interface.

2. Second Embodiment (Example of Structure of Solid-state Imaging Device)

Figure 10:
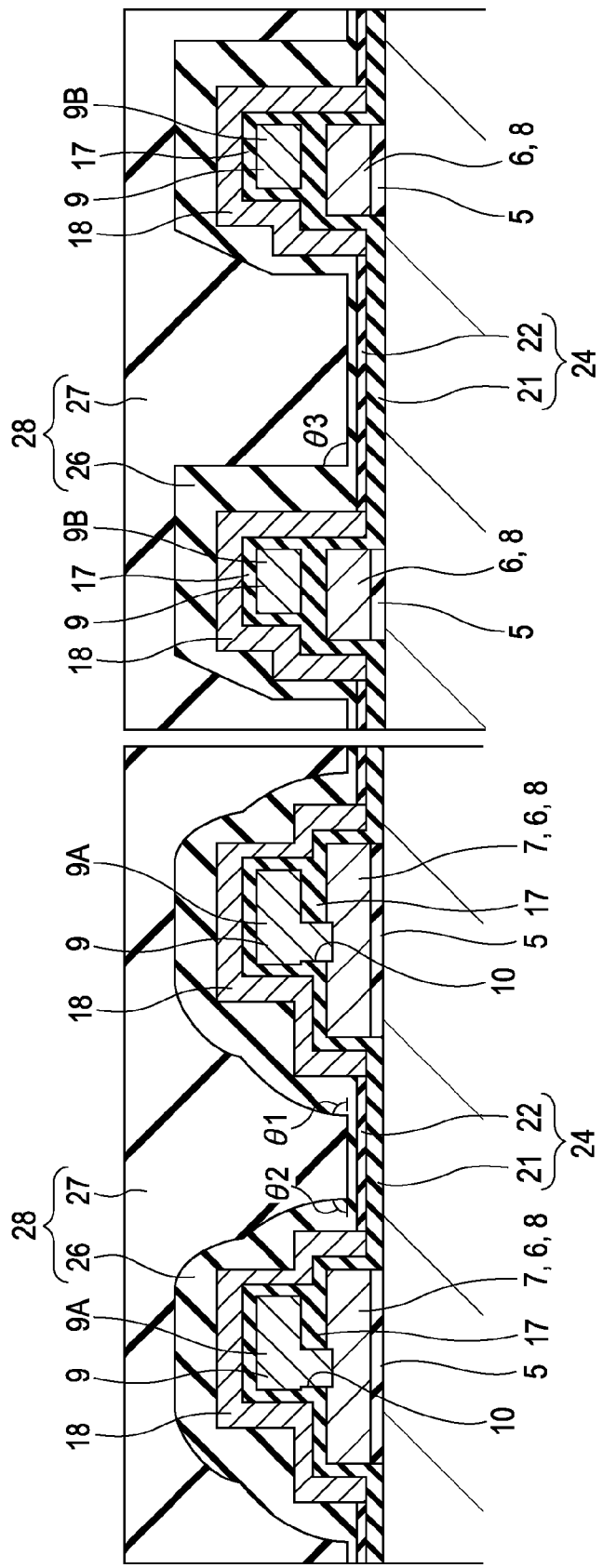
FIG. 10 includes schematic cross-sectional views of a main portion of a solid-state imaging device according to a second embodiment of the present invention.

FIG. 10 shows an example of a solid-state imaging device according to a second embodiment of the present invention, which is applied to a CCD solid-state imaging device. FIG. 10 shows a main portion of an imaging region of the solid-state imaging device, in particular, light-sensing sections and waveguides, in which the left portion shows a cross-sectional structure taken in the horizontal direction, and the right portion shows a cross-sectional structure taken in the vertical direction.

In a solid-state imaging device 41 according to this embodiment, a connecting conductive layer 9 is disposed on each of transfer electrodes 6 to 8 so as to be shifted in the width direction with respect to the axis O of the transfer electrode such that the cross-sectional structure of a waveguide 28 in the horizontal direction of an imaging plane is different from that in the vertical direction. That is, in a vertical transfer register section 3, extending portions 9A of the connecting conductive layers 9 composed of a second-layer polysilicon film are disposed on the transfer electrodes 6 to 8 composed of a first-layer polysilicon film with an insulating film 17 therebetween so as to be shifted in the width direction and asymmetrical with respect to the axis O of each of the transfer electrodes 6 to 8. In this example, the extending portion 9A has a line width that is smaller than the electrode width of each of the transfer electrodes 6 to 8 and is disposed so as to be shifted to the right side in FIG. 10. In the space between the vertically adjacent light-sensing sections 2, a strip portion 9B of the connecting conductive layer 9 composed of the second-layer polysilicon film is disposed on the transfer electrode 6 or 8 composed of the first-layer polysilicon film with an insulating film therebetween so as to be shifted in the width direction and asymmetrical with respect to the axis O of the transfer electrode 6 or 8. In this example, the strip portion 9B has a line width that is smaller than the electrode width of each of the transfer electrodes 6 and 8, and is disposed so as to be shifted to the right side in FIG. 10 such that one end of the strip portion 9B aligns with one end of the transfer electrode 6 or 8. The cross-sectional shape of the light-shielding film is also asymmetrical with respect to the axis O both in the horizontal direction and in the vertical direction.

On the basis of such a configuration of the transfer electrodes 6 to 8 and the connecting conductive layers 9, waveguides 28 are disposed on the light-sensing sections 2. The cross-sectional structure of each waveguide 28 taken in the horizontal direction of the imaging plane is different from that in the vertical direction. That is, in the cross-section taken in the horizontal direction, one inclination angle θ1 of the interface between the core layer 27 and the cladding layer 26 is gentle, and another inclination angle θ2 is steep. In the cross-section taken in the vertical direction, one inclination angle θ3 of the interface between the core layer 27 and the cladding layer 26 is 90 degrees, i.e., vertical, and another inclination angle has a predetermined value. That is, the inclination angle in each of the vertical cross-section and the horizontal cross-section is asymmetrical with respect to the axis in the waveguiding direction. The other structures, including the structures not shown, are the same as those in FIGS. 1 to 3. The same reference numerals are used to indicate the corresponding components, and the detailed description thereof will be omitted.

(Example of Manufacturing Method of Solid-state Imaging Device)

FIGS. 11A and 11B show steps in a method of manufacturing a solid-state imaging device according to the second embodiment, in particular, a process of fabricating a waveguide. In each drawing, the left portion corresponds to a cross-section taken along in the horizontal direction, and the right portion corresponds to a cross-section taken in the vertical direction.

As shown in FIG. 11A, transfer electrodes 6, 7, and 8 each composed of a first-layer polysilicon film are formed repeatedly on a semiconductor substrate 11 with a gate insulating film 5 therebetween. In the semiconductor substrate 11, although some of them are not shown, photodiodes (PDs) constituting light-sensing sections 2, transfer channel regions 4, p+ channel stop regions 15, etc. have been formed. Furthermore, connecting conductive layers 9 (9A and 9B) composed of a second-layer polysilicon film are formed thereon with an insulating film 17 therebetween, extending portions 9A being connected to the transfer electrodes 7.

The extending portion 9A of the connecting conductive layer 9 is formed so as to have a line width that is smaller than the electrode width and so as to be asymmetrical with respect to the axis O of each of the transfer electrodes 6 to 8. In the space between the light-sensing sections in the vertical direction, the strip portion 9B of the connecting conductive layer 9 is formed so as to have a line width that is smaller than the electrode width of the transfer electrode 6 or 8 and so as to be asymmetrical with respect to the axis O of the transfer electrode 6 or 8 such that one end of the strip portion 9B aligns with one end of the transfer electrode.

Next, excluding the light-sensing sections 2, a light-shielding film 18, for example, composed of Al, is formed so as to cover the transfer electrodes 6 to 8 and the connecting conductive layers 9 with an insulating film 17 therebetween. The light-shielding film 18 is formed such that its cross-sectional shape is asymmetrical with respect to the axis O both in the horizontal direction and in the vertical direction.

Next, as shown in FIG. 11B, a cladding layer 26 is formed in the recesses on the light-sensing sections so as to follow the surface of the layered structure including the transfer electrodes, the connecting conductive layers, and the light-shielding film. The cladding layer is formed in the same manner as that described in the manufacturing method according to the first embodiment. Next, the cladding layer is shaped. Thereby, in the cross-section taken in the vertical direction, an inclined surface having a gentle inclination angle θ1 and an inclined surface having a steep inclination angle θ2 (θ1>θ2) are formed.

Next, a core layer 27 is formed over the entire surface so as to be embedded in recesses. The surface of the core layer 27 is planarized. The cladding layer 26 and the core layer 27 constitute waveguides 28 according to the second embodiment. In the subsequent steps, although not shown, as in the usual manner, a passivation layer, a planarizing layer, an on-chip color filter, and on-chip microlenses are formed, thereby to obtain an intended solid-state imaging device 41.

Additionally, the cross-sectional structure including the transfer electrodes and the connecting conductive layers in the vertical transfer register section 3 and/or the cross-sectional structure in the space between the vertically adjacent pixels can be formed asymmetrically with respect to the axis O.

In the solid-state imaging device according to the second embodiment, the cross-sectional shape of the waveguide 28, in particular, the shape of the interface between the core layer 27 and the cladding layer 26, is formed asymmetrically with respect to the axis in the waveguiding direction in each of the horizontal cross-section and the vertical cross-section. Thus, in the cross-sectional structure taken in the horizontal direction and in the cross-sectional structure taken in the vertical direction, core widths at the same height are different, and inclination angles at the interface between the core layer 27 and the cladding layer 26 are asymmetrical with respect to the axis. Consequently, the phases of light incident on the waveguide 28 and totally reflected are not easily aligned, standing waves are not easily generated, and the occurrence of spectral ripples can be suppressed. Thus, imaging characteristics can be improved.

3. Third Embodiment (Example of Structure of Solid-state Imaging Device)

Figure 12:
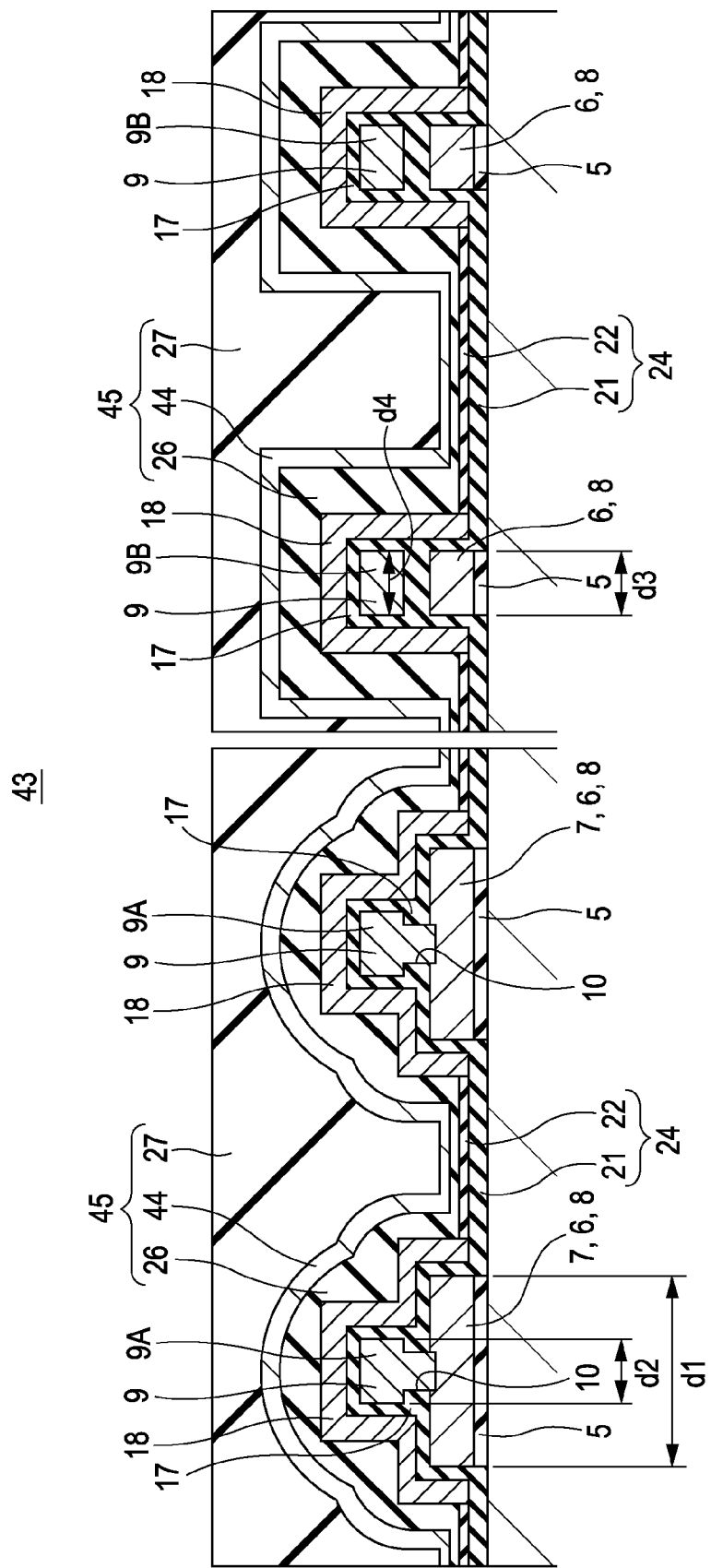
FIG. 12 includes schematic cross-sectional views of a main portion of a solid-state imaging device according to a third embodiment of the present invention.

FIG. 12 shows an example of a solid-state imaging device according to a third embodiment of the present invention, which is applied to a CCD solid-state imaging device. FIG. 12 shows a main portion of an imaging region of the solid-state imaging device, in particular, light-sensing sections and waveguides, in which the left portion shows a cross-sectional structure taken in the horizontal direction, and the right portion shows a cross-sectional structure taken in the vertical direction.

In a solid-state imaging device 43 according to this embodiment, the transfer electrodes 6 to 8 and the connecting conductive layers 9 in the vertical transfer register section 3 are formed as in the first embodiment, and waveguides are formed in a three-layered structure including layers having different refractive indices such that the cross-sectional structure of each waveguide in the horizontal direction of the imaging plane is different from that in the vertical direction.

That is, on the vertical transfer register section 3, the width d2 of the extending portion 9A of the connecting conductive layer 9 composed of the second-layer polysilicon film is set smaller than the width d1 of each of the transfer electrodes 6 to 8 composed of the first-layer polysilicon film (d1>d2). In the meantime, on the space between the vertically adjacent light-sensing sections 2, the width d3 of each of the transfer electrodes 6 and 8 composed of the first-layer polysilicon film is set substantially the same as the width d4 of the strip portion 9B of the connecting conductive layer 9 composed of the second-layer polysilicon film (d3=d4). In the cross-section taken in the horizontal direction, a laminate including any one of the transfer electrodes 6 to 8 and the connecting conductive layer 9 is formed symmetrically with respect to the axis O. In the cross-section taken in the vertical direction, a laminate including the transfer electrode 6 or 8 and the connecting conductive layer 9 is also formed symmetrically with respect to the axis O.

On the basis of such a configuration of the transfer electrodes 6 to 8 and the connecting conductive layers 9, waveguides 45 are disposed on the light-sensing sections 2, the waveguides 45 each including a cladding layer 26 having a low refractive index, a core layer 27 having a high refractive index, and an intermediate layer 44 having a refractive index that is different from that of the core layer 27 disposed between the cladding layer 26 and the core layer 27. The refractive index of the intermediate layer 44 is different from that of each of the cladding layer 26 and the core layer 27. The refractive index of the intermediate layer 44 may be higher than that of the core layer 27, or may be higher than that of the cladding layer 26 and lower than the core layer 27. The cladding layer 26 is formed in the recesses on the light-sensing sections 2 so as to follow the surface of the layered structure. The intermediate layer 44 is formed so as to follow the surface of the cladding layer 26, the intermediate layer 44 having substantially the same shape as the cladding layer 26. The waveguide 45 includes two interfaces of different refractive indices, i.e., the interface between the cladding layer 26 and the intermediate layer 44 and the interface between the intermediate layer 44 and the core layer 27. The intermediate layer 44 is composed of, for example, silicon nitride (SiN), silicon carbide (SiC), silicon oxynitride (SiON), or silicon oxide ($SiO_2$).

In the waveguide 45, as in the first embodiment, in the cross-sectional structure taken in the horizontal direction and in the cross-sectional structure taken in the vertical direction, core widths at the same height are different, and inclination angles at the interfaces are different. In the waveguide 45, two interfaces having high asymmetry in the horizontal and vertical directions are formed.

Since the other structures, including the structures not shown, are the same as those in FIGS. 1 to 3, the detailed description thereof will be omitted.

In the solid-state imaging device 41 according to the third embodiment, light incident on the waveguide 45 is reflected at the interface between the core layer and the intermediate layer and at the interface between the intermediate layer and the cladding layer. In addition to the fact that the cross-sectional structure of the waveguide 45 in the horizontal direction of the imaging plane is different from that in the vertical direction, the number of interface reflections increases. Therefore, the phases of light interface-reflected are further not easily aligned, and spectral ripples can be further suppressed. Consequently, imaging characteristics can be further improved.

(Example of Manufacturing Method of Solid-state Imaging Device)

FIGS. 13A to 13C and FIGS. 14D and 14E show steps in a method of manufacturing a solid-state imaging device according to the third embodiment, in particular, a process of fabricating a waveguide. In each drawing, the left portion corresponds to a cross-sectional structure taken in the horizontal direction, and the right portion corresponds to a cross-sectional structure taken in the vertical direction.

Figure 13A:
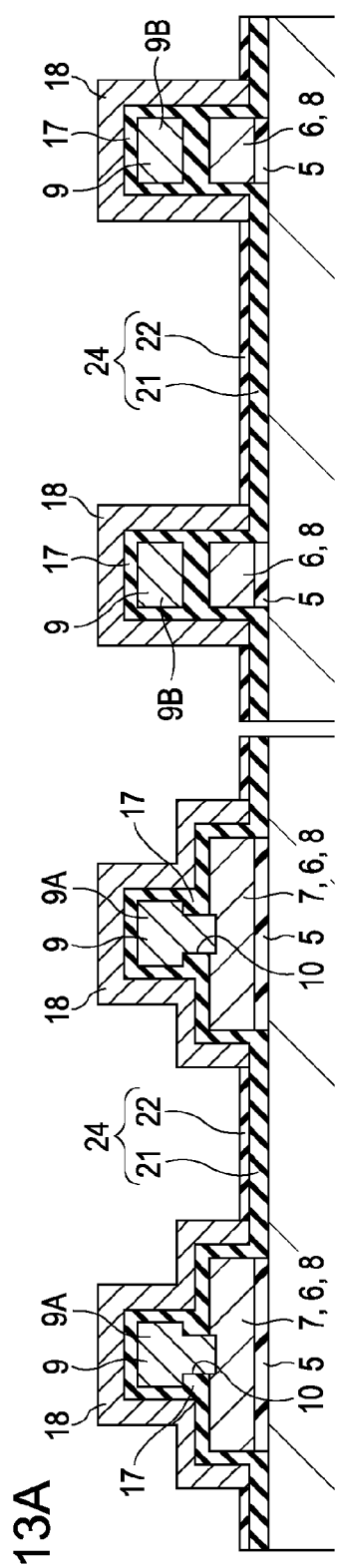
FIGS. 13A to 13C show steps in a method of manufacturing a solid-state imaging device according to the third embodiment.

First, as shown in FIG. 13A, transfer electrodes 6, 7, and 8 each composed of a first-layer polysilicon film are formed on a semiconductor substrate 11 with a gate insulating film 5 therebetween. Connecting conductive layers 9 (9A and 9B) composed of a second-layer polysilicon film are formed on the transfer electrodes 6 to 8 with an insulating film 17 therebetween, extending portions 9A being connected to the transfer electrodes 7. In the semiconductor substrate 11, although some of them are not shown, photodiodes (PDs), transfer channel regions 4, p+ channel stop regions 15, etc. have been formed.

The extending portions 9A of the connecting conductive layers 9 are formed with a width that is smaller than the electrode width of each of the transfer electrodes 6 to 8 and symmetrically with respect to the axis O. In the space between the vertically adjacent light-sensing sections 2, the strip portion 9B of the connecting conductive layer 9 is formed with the same width as the electrode width of the transfer electrode 6 or 8 and symmetrically with respect to the axis O.

Next, excluding the light-sensing sections 2, a light-shielding film 18, for example, composed of Al, is formed so as to cover the transfer electrodes 6 to 8 and the connecting conductive layers 9 with an insulating film 17 therebetween. The light-shielding film 18 is formed such that its cross-sectional shape is symmetrical with respect to the axis O both in the horizontal direction and in the vertical direction.

Figure 13B:
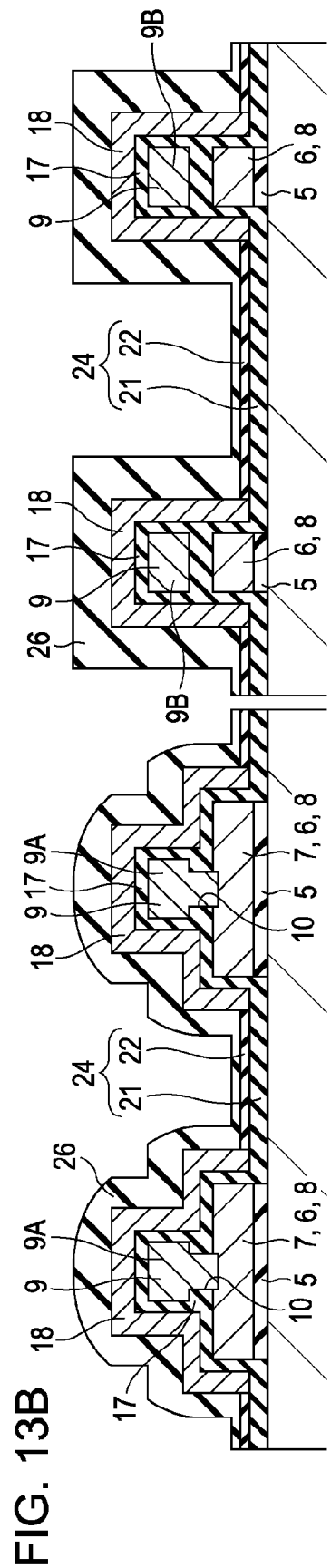

Next, as shown in FIG. 13B, a cladding layer 26 composed of a low-refractive index material is formed in the recesses on the light-sensing sections 2 so as to follow the surface of the layered structure including the transfer electrodes 6 to 8, the connecting conductive layers 9, and the light-shielding film 18. As the low-refractive index material (cladding material), for example, a silicon oxide ($SiO_2$) film can be used. As in the case described above, examples of the silicon oxide film that can be used include an NSG film formed by thermal CVD, a BPSG film, a PSG film, and a plasma silicon oxide film formed by plasma CVD.

Figure 13C:
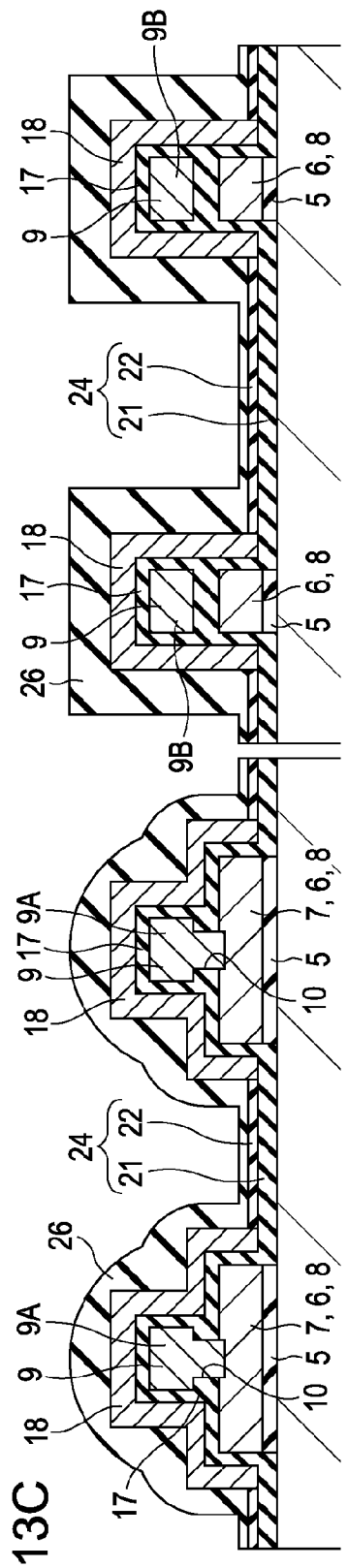

Next, as necessary, as shown in FIG. 13C, the cladding layer 26 is shaped. The shaping can be performed, for example, by dry etching, heat treatment, or the like. Thereby, the shape of the cladding layer 26 is controlled. In the cross-section taken in the horizontal direction of the imaging plane, the cladding layer 26 remains with a predetermined thickness on the surfaces corresponding to the light-sensing sections and smooth inclined surfaces (including curved surfaces) are formed. Similarly, in the cross-section taken in the vertical direction of the imaging plane, the cladding layer 26 remains with a predetermined thickness on the surfaces corresponding to the light-sensing sections and vertical surfaces are formed.

Figure 14D:
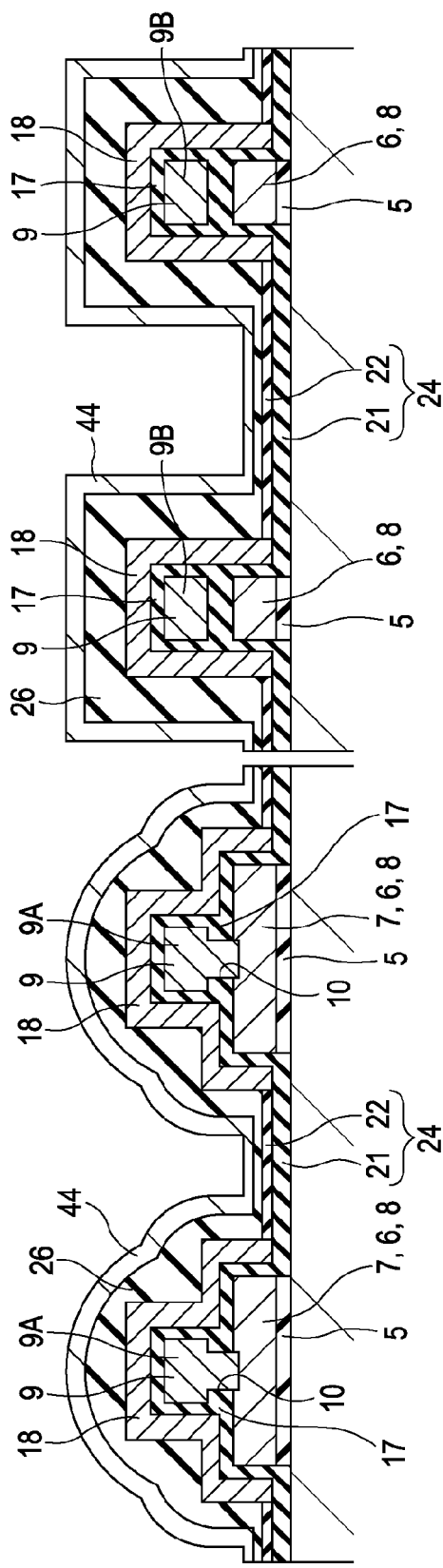
FIGS. 14D and 14E show steps subsequent to the step shown in FIG. 13C in the method of manufacturing a solid-state imaging device according to the third embodiment.

Next, as shown in FIG. 14D, an intermediate layer 44 is formed on the cladding layer 26 using a material having a higher refractive index than the cladding layer 26. The intermediate layer 44 is formed so as to have substantially the same surface shape as that of the cladding layer 44. As the material (intermediate material) for forming the intermediate layer 44, for example, silicon nitride (SiN), silicon carbide (SiC), silicon oxynitride (SiON), or silicon oxide ($SiO_2$) can be used.

Figure 14E:
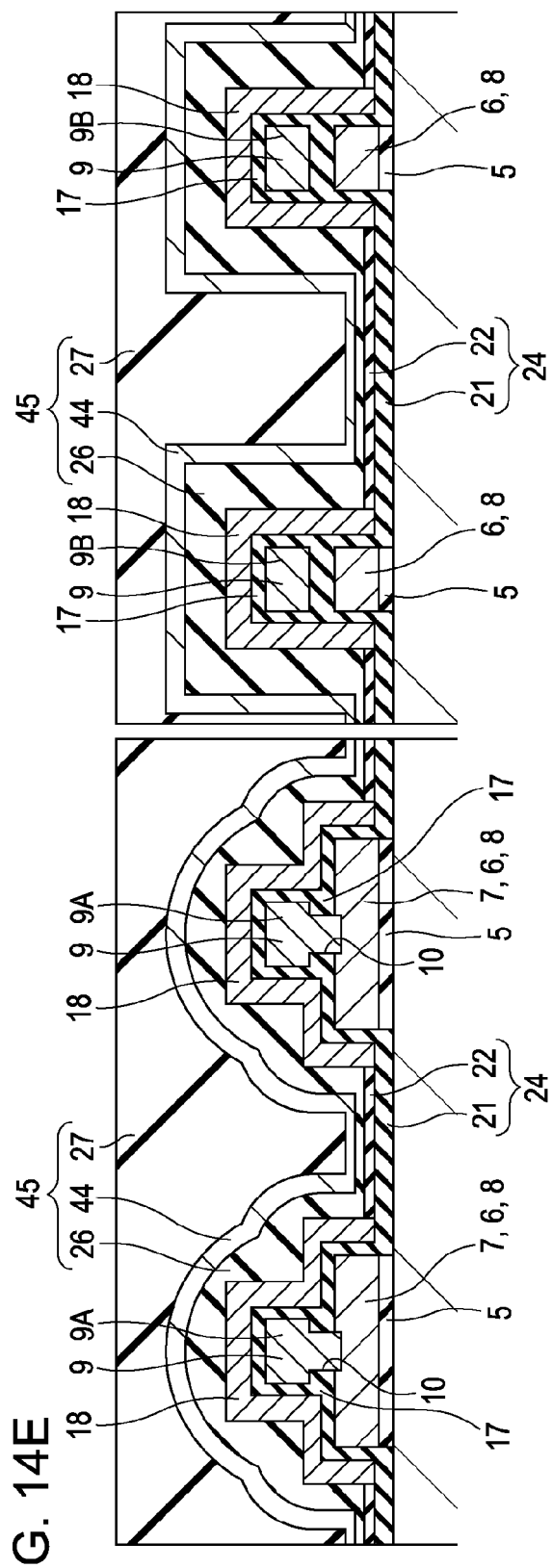

Next, as shown in FIG. 14E, a core layer 27 composed of a high-refractive-index material is formed over the entire surface so as to cover the intermediate layer 44 and be embedded in recesses on the light-sensing sections 2. The refractive index of the core layer 26 may be higher or lower than the refractive index of the intermediate layer 44 as long as it is higher than the refractive index of the cladding layer 26. As the material (core material) for forming the core layer 26, silicon nitride (SiN), silicon oxynitride (SiON), or silicon carbide (SiC) can be used. The surface of the core layer 27 is planarized. The cladding layer 26, the intermediate layer 44, and the core layer 27 constitute waveguides 45 having a three-layered structure.

In the subsequent steps, although not shown, as in the usual manner, a passivation layer, a planarizing layer, an on-chip color filter, and on-chip microlenses are formed, thereby to obtain an intended solid-state imaging device 43.

4. Fourth Embodiment (Example of Structure of Solid-state Imaging Device)

Figure 15:
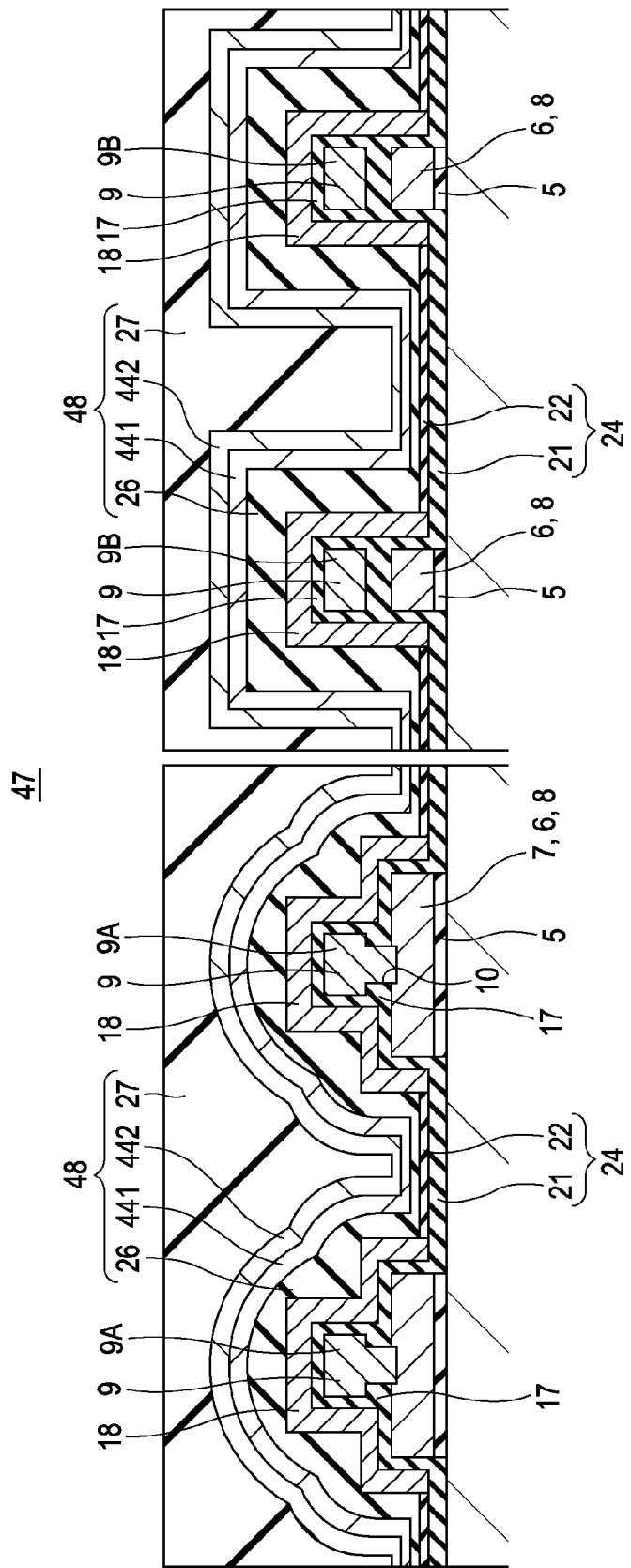
FIG. 15 includes schematic cross-sectional views of a main portion of a solid-state imaging device according to a fourth embodiment of the present invention.

FIG. 15 shows an example of a solid-state imaging device according to a fourth embodiment of the present invention, which is applied to a CCD solid-state imaging device. FIG. 15 shows a main portion of an imaging region of the solid-state imaging device, in particular, light-sensing sections and waveguides, in which the left portion shows a cross-sectional structure taken in the horizontal direction, and the right portion shows a cross-sectional structure taken in the vertical direction.

In a solid-state imaging device 47 according to this embodiment, waveguides 48 having a multi-layered structure are formed on light-sensing sections 2. In the multi-layered waveguide 48, between a cladding layer 26 having a low refractive index and a core layer 27 having a high refractive index, intermediate layers each having a different refractive index from the high refractive index of the core layer 27 are disposed. In this example, as the intermediate layers, intermediate layers 441 and 442 are used. The intermediate layers 441 and 442 are formed with substantially the same surface shape as that of the cladding layer 26 so as to follow the surface of the cladding layer 26. The intermediate layers 441 and 442 each have a higher refractive index than the cladding layer 26. The refractive index of each of the intermediate layers 441 and 442 may be higher or lower than that of the core layer 27. As the materials for the intermediate layers 441 and 442, silicon nitride (SiN), silicon oxynitride (SiON), or silicon carbide (SiC) in which the compositional ratio of nitrogen, oxygen, and carbon is varied can be used.

The configuration of the transfer electrodes 6 to 8 and the connecting conductive layers 9 is the same as that in the third embodiment. On the basis of such a configuration of the transfer electrodes and the connecting conductive layers, waveguides 48 having a multi-layered structure are disposed on the light-sensing sections 2. The cross-sectional structure of each waveguide 48 taken in the horizontal direction of the imaging plane is different from that in the vertical direction. That is, the core width in the cross-section of the waveguide taken in the horizontal direction of the imaging plane is different from that in the vertical direction, at the same height.

The other structures, including the structures not shown, are the same as those in FIGS. 1 to 3. The same reference numerals are used to indicate the corresponding components, and the detailed description thereof will be omitted.

In the solid-state imaging device 47 according to the fourth embodiment, light incident on the waveguide 48 is reflected at the interfaces among the core layer 27, the intermediate layers 441 and 442, and the cladding layer 26. In addition to the fact that the cross-sectional structure of the waveguide 48 in the horizontal direction of the imaging plane is different from that in the vertical direction, the number of interface reflections increases. This results in phase shift in light, the phases of light interface-reflected are further not easily aligned, and spectral ripples can be further suppressed. Consequently, imaging characteristics can be further improved.

5. Fifth Embodiment (Example of Structure of Solid-state Imaging Device)

Figure 16:
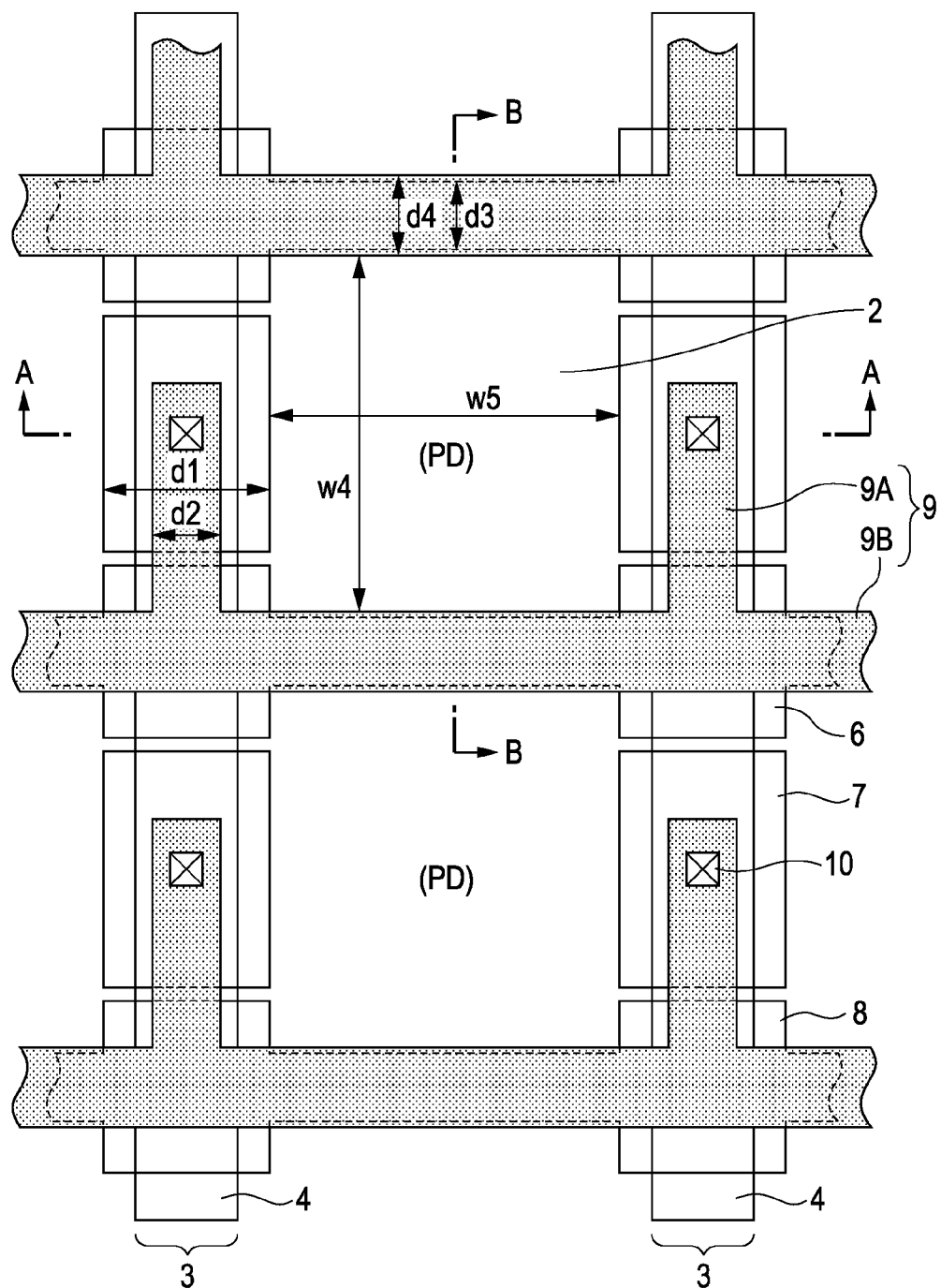
FIG. 16 is a schematic plan view showing a main portion of a solid-state imaging device according to a fifth embodiment of the present invention.
Figure 17:
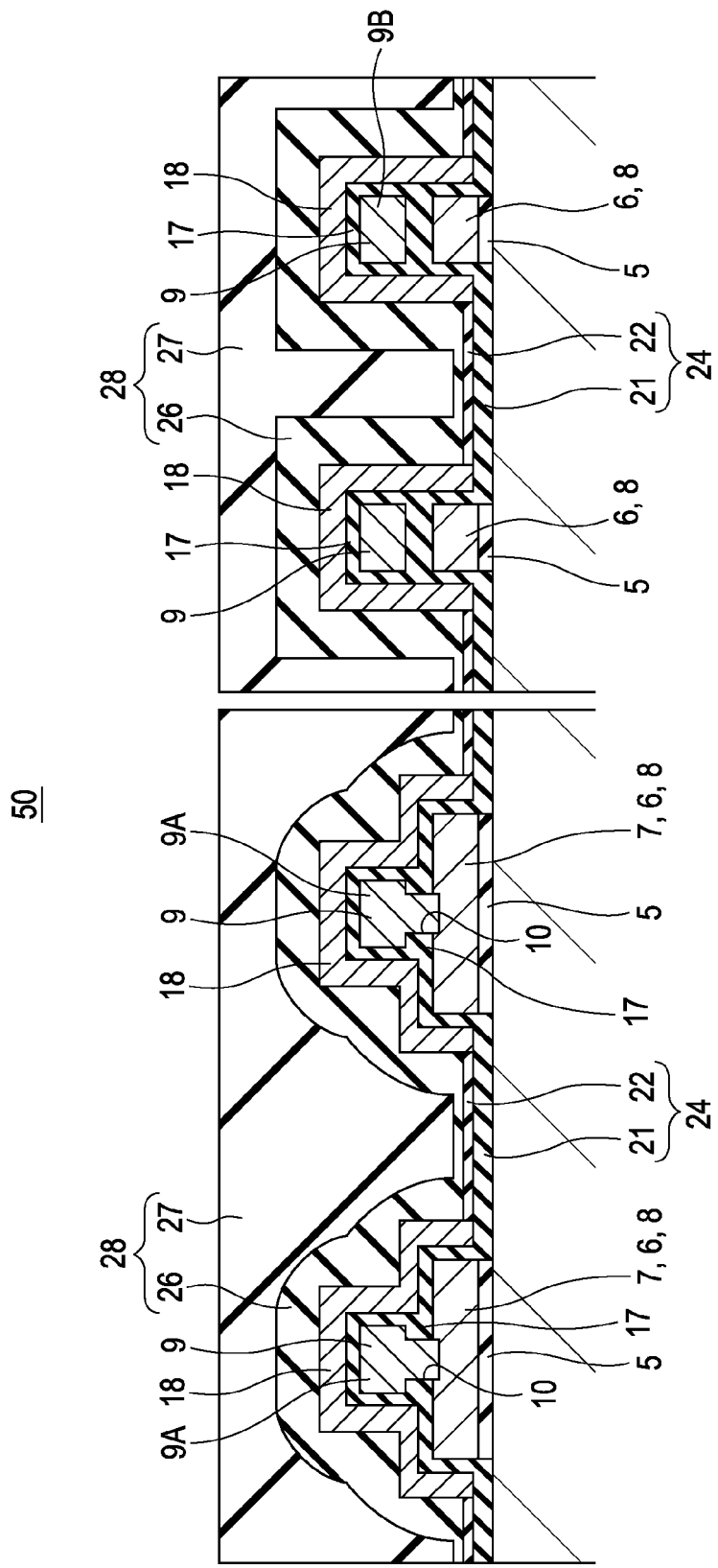
FIG. 17 includes schematic cross-sectional views of a main portion of the solid-state imaging device according to the fifth embodiment of the present invention.

FIGS. 16 and 17 show an example of a solid-state imaging device according to a fifth embodiment of the present invention, which is applied to a CCD solid-state imaging device. FIG. 16 is a plan view showing a main portion of an imaging region of the CCD solid-state imaging device, and FIG. 17 shows cross-sectional structures taken along the line A-A and the line B-B of FIG. 16, in particular, cross-sectional structures of light-sensing sections and waveguides. In FIG. 17, the left portion shows a cross-sectional structure taken along the line A-A, and the right portion shows a cross-sectional structure taken along the line B-B.

Referring to FIG. 16, a solid-state imaging device 50 according to this embodiment has light-sensing sections 2 having a square shape in top plan view, in which the opening width w5 in the longitudinal direction is equal to the opening width w5 in the lateral direction (w5=w5). The structures of transfer electrodes 6 to 8, connecting conductive layers 9 (9A and 9B), waveguides 28, and the other structures including transfer channel regions 4 and p+ channel stop regions 5 are the same as those in the first embodiment shown in FIGS. 1 to 3. The same reference numerals are used to indicate the corresponding components, and the detailed description thereof will be omitted.

In the solid-state imaging device 50 according to the fifth embodiment, even though the light-sensing sections 2 each has a square shape in top plan view, the cross-sectional structure of the waveguide 28 on the light-sensing section 2 taken in the horizontal direction of the imaging plane (cross-section taken along the line A-A) is different from the cross-sectional structure of the waveguide 28 on the light-sensing section 2 taken in the vertical direction (cross-section taken along the line B-B). Consequently, as in the first embodiment, the phases of light totally reflected at the waveguide 28 are not easily aligned, standing waves are not easily generated, and the occurrence of spectral ripples is suppressed. Therefore, the imaging characteristics of the solid-state imaging device can be improved.

6. Sixth Embodiment (Example of Structure of Solid-state Imaging Device)

In a solid-state imaging device according to a sixth embodiment (not shown), light-sensing sections 2 are each formed so as to have a square shape in top plan view as shown in FIG. 16. In the structure in which square light-sensing sections 2 are formed, as the waveguides, the waveguides 28 which are based on a layered structure of transfer electrodes and connecting conductive layers according to the second embodiment, the multilayered waveguides 45 according to the third embodiment, or the multilayered waveguides 48 according to the fourth embodiment may be employed.

In the solid-state imaging device according to the sixth embodiment, as in the embodiments described above, generation of standing waves in the waveguides is suppressed, and the occurrence of spectral ripples is suppressed. Therefore, the imaging characteristics of the solid-state imaging device can be improved.

In each of the first, third, fourth, and fifth embodiments, the width of the extending portions 9A of the connecting conductive layers 9 on the vertical transfer register sections 3 is set smaller than the width of the transfer electrodes 6 to 8 located thereunder, and the width of the strip portion 9B of the connecting conductive layer 9 located between the vertically adjacent light-sensing sections is set substantially the same as the width of the transfer electrode 6 or 8. Alternatively, a configuration may be employed in which the width of the extending portions 9A of the connecting conductive layers 9 on the vertical transfer register sections 3 is set substantially the same as the width of the transfer electrodes 6 to 8 located below, and the width of the strip portion 9B of the connecting conductive layer 9 located between the vertically adjacent light-sensing sections is set smaller than the width of the transfer electrode 6 or 8 located thereunder.

7. Seventh Embodiment (Example of Structure of Solid-state Imaging Device)

Figure 18:
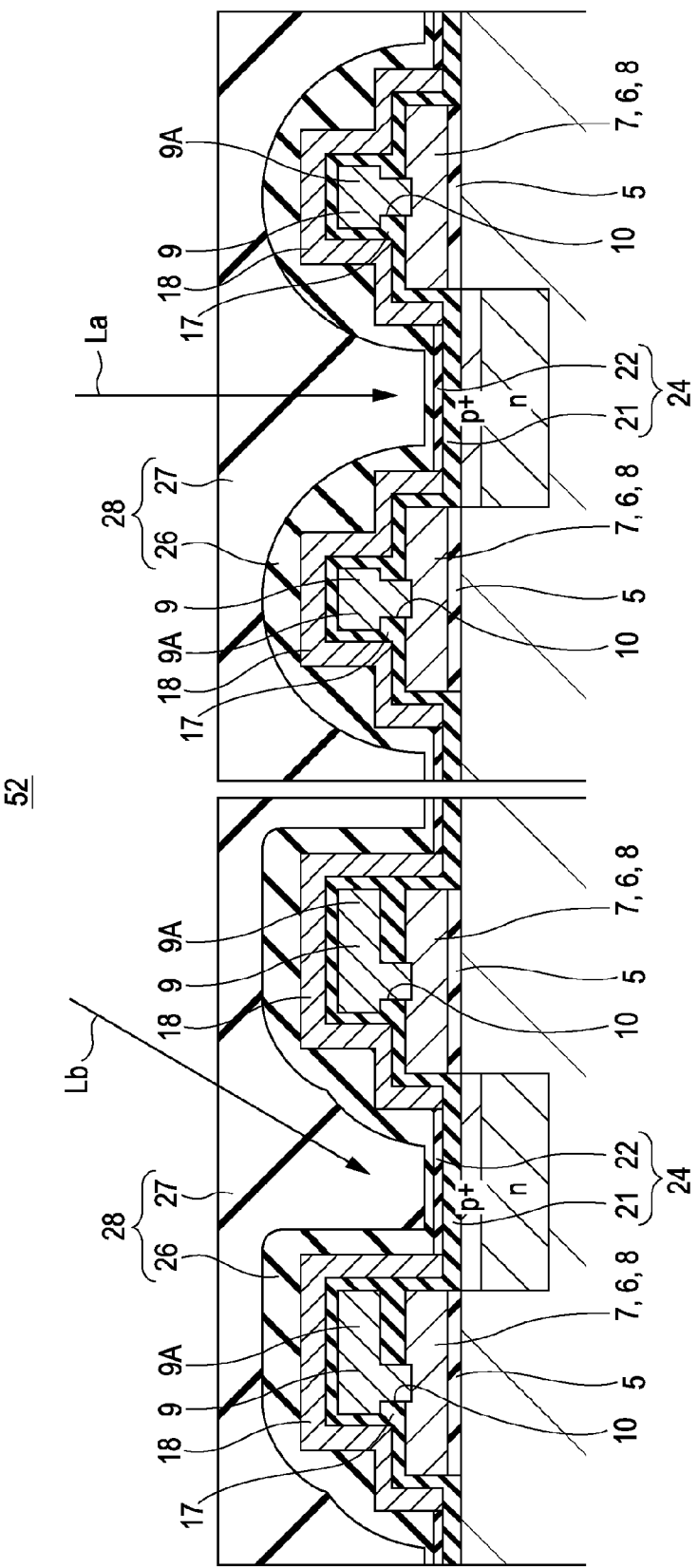
FIG. 18 includes schematic cross-sectional views of a main portion of a solid-state imaging device according to a seventh embodiment of the present invention.

FIG. 18 shows an example of a solid-state imaging device according to a seventh embodiment of the present invention, which is applied to a CCD solid-state imaging device. FIG. 18 includes cross-sectional views of a main portion of an imaging region taken in the horizontal direction, in which the left portion shows a cross-sectional structure of a waveguide in the peripheral area of the imaging region, and the right portion shows a cross-sectional structure of a waveguide in the central area of the imaging region.

In a solid-state imaging device 52 according to this embodiment, in each of waveguides 28 on the light-sensing sections 2, the cross-sectional structure taken in the horizontal direction of the imaging plane is different from the cross-sectional structure taken in the vertical direction. In addition, in this embodiment, as shown in the left portion of FIG. 18, the waveguide 28 on a light-sensing section 2 located in the peripheral area of the imaging region is configured such that the interface between the core layer 27 and the cladding layer 26 largely inclines toward the center of the imaging region. As shown in the right portion of FIG. 18, the waveguide 28 on a light-sensing section 2 located in the central area of the imaging region is configured such that the inclination of the interface between the core layer 27 and the cladding layer 26 is symmetrical. Although not shown, with respect to the cross-sectional structure of the waveguide 28 taken in the vertical direction of the imaging region, similarly, the structures are different between the peripheral area and the central area.

Since the other structures are the same as those in the first embodiment, the detailed description thereof will be omitted.

In the solid-state imaging device 52 according to the seventh embodiment, in the central area of the imaging region, light La is incident vertically on the light-sensing section 2 through the waveguide 28. In the peripheral area, since the waveguide 28 is configured so as to be directed obliquely upward, the light collection efficiency of oblique light Lb is improved, and the shading property can be improved. Furthermore, as in the first embodiment, the occurrence of spectral ripples in the waveguide is suppressed, and the imaging characteristics of the solid-state imaging device can be improved.

8. Eighth Embodiment (Example of Structure of Solid-state Imaging Device)

Figure 19:
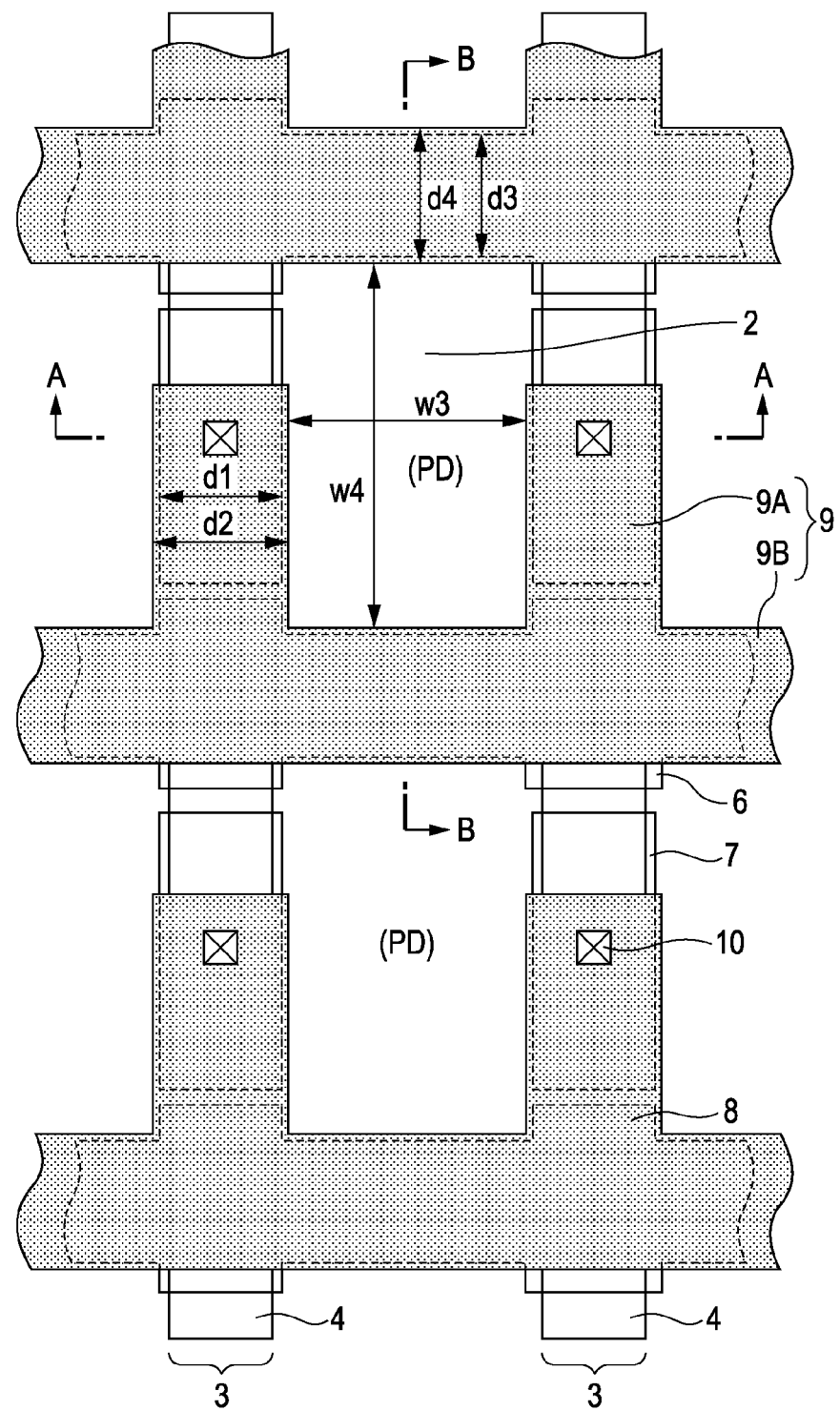
FIG. 19 is a schematic plan view showing a main portion of a solid-state imaging device according to an eighth embodiment of the present invention.
Figure 20:
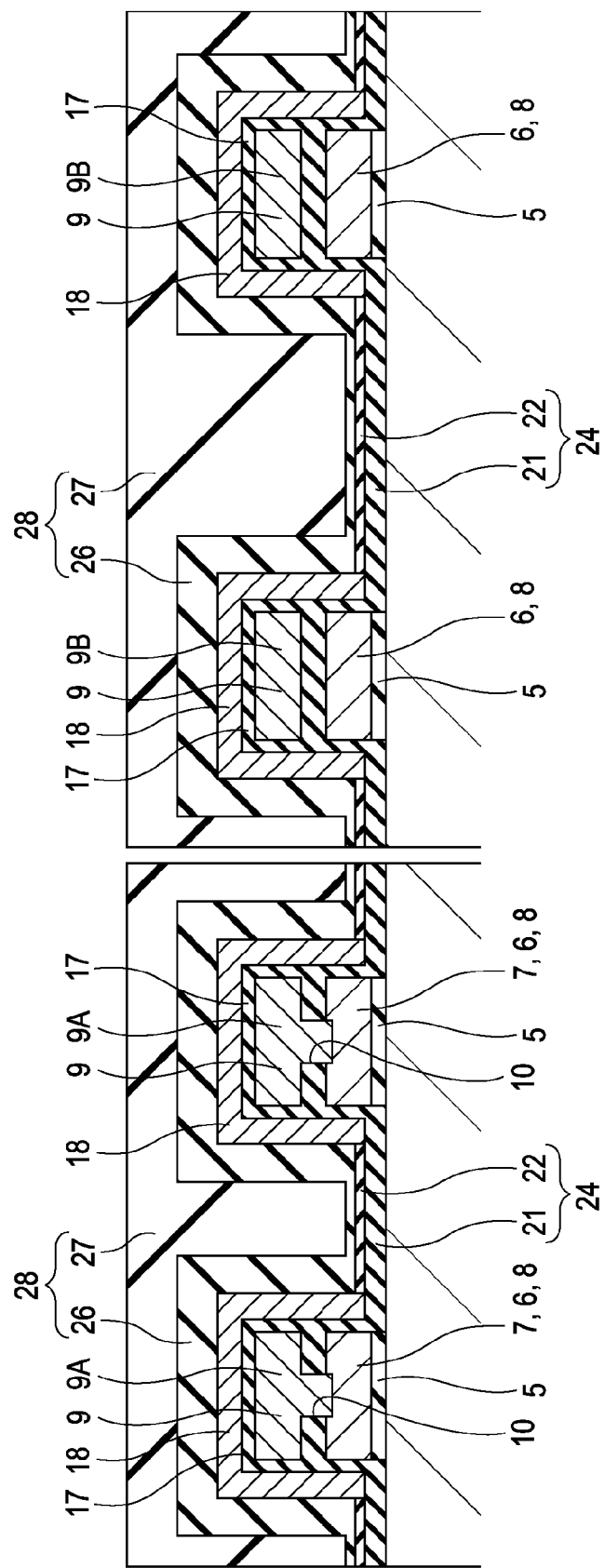
FIG. 20 includes schematic cross-sectional views of a main portion of an example of the solid-state imaging device according to the eighth embodiment of the present invention.
Figure 21:
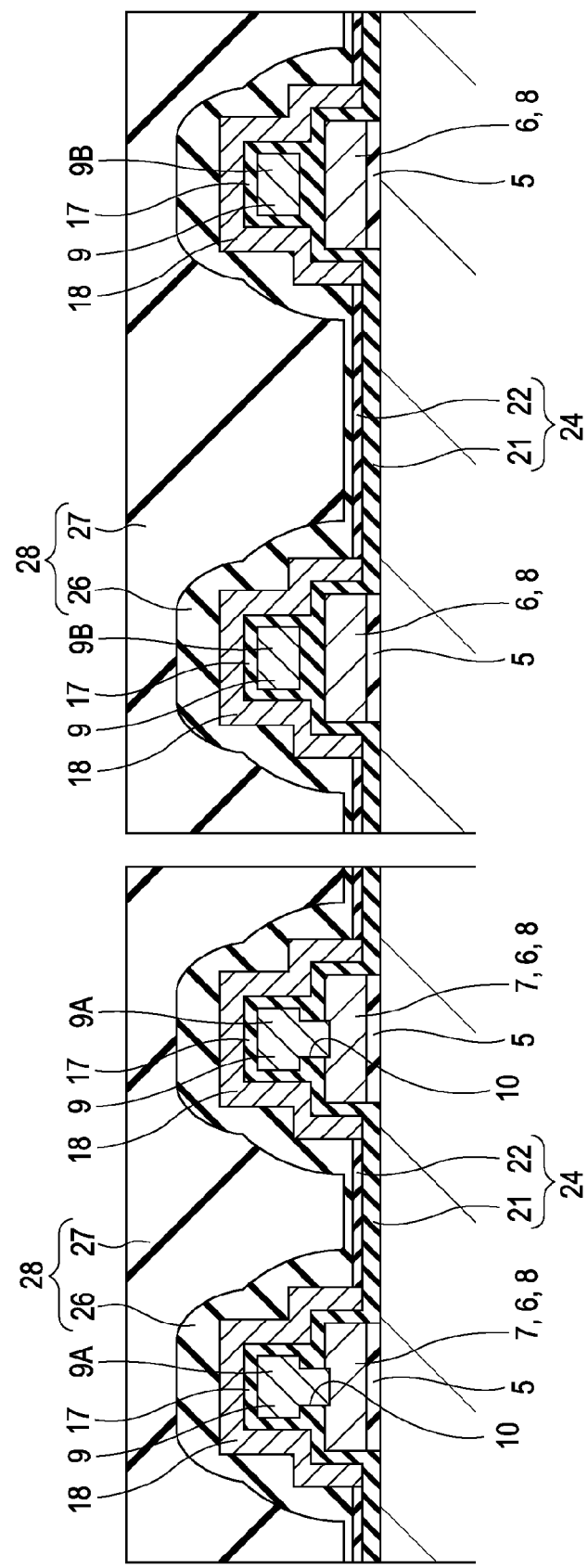
FIG. 21 includes schematic cross-sectional views of a main portion of another example of the solid-state imaging device according to the eighth embodiment of the present invention.

FIGS. 19 to 21 show an example of a solid-state imaging device according to an eighth embodiment of the present invention, which is applied to a CCD solid-state imaging device. Referring to FIG. 19, a solid-state imaging device 54 according to this embodiment has light-sensing sections 2 having a rectangular shape in top plan view. A layered structure including transfer electrodes 6 to 8 and connecting conductive layers 9 located on a vertical transfer register section 3 is configured to be the same as that located between the vertically adjacent light-sensing sections 2. That is, for example, as shown in FIG. 20, the width of the transfer electrodes 6 to 8 is set to be the same as the width of the extending portions 9A of the connecting conductive layers 9 on the vertical transfer register section 3, and the width of the transfer electrode 6 or 8 is set to be the same as the width of the connecting conductive layer located thereon in the space between the vertically adjacent light-sensing sections 2. Alternatively, as shown in FIG. 21, the width of the extending portions 9A of the connecting conductive layers 9 is set smaller than the width of the transfer electrodes 6 to 8 on the vertical transfer register section 3, and the width of the strip portions 9B of the connecting conductive layers 9 is set smaller than the width of the transfer electrode 6 or 8.

Since the other structures are the same as those in the first embodiment, the detailed description thereof will be omitted.

In the solid-state imaging device 54 according to the eighth embodiment, since the light-sensing section 2 has a rectangular shape, in the waveguide on the light-sensing section 2, the core width in the cross-sectional structure taken in the horizontal direction of the imaging plane is different from the core width in the cross-sectional structure taken in the vertical direction. Since the core width in the horizontal direction is different from the core width in the vertical direction, the phases of light totally reflected are not easily aligned, and standing waves are not easily generated. Therefore, the occurrence of spectral ripples is suppressed, and imaging characteristics can be improved.

9. Ninth Embodiment
(Example of Structure of Solid-state Imaging Device)

Figure 22:
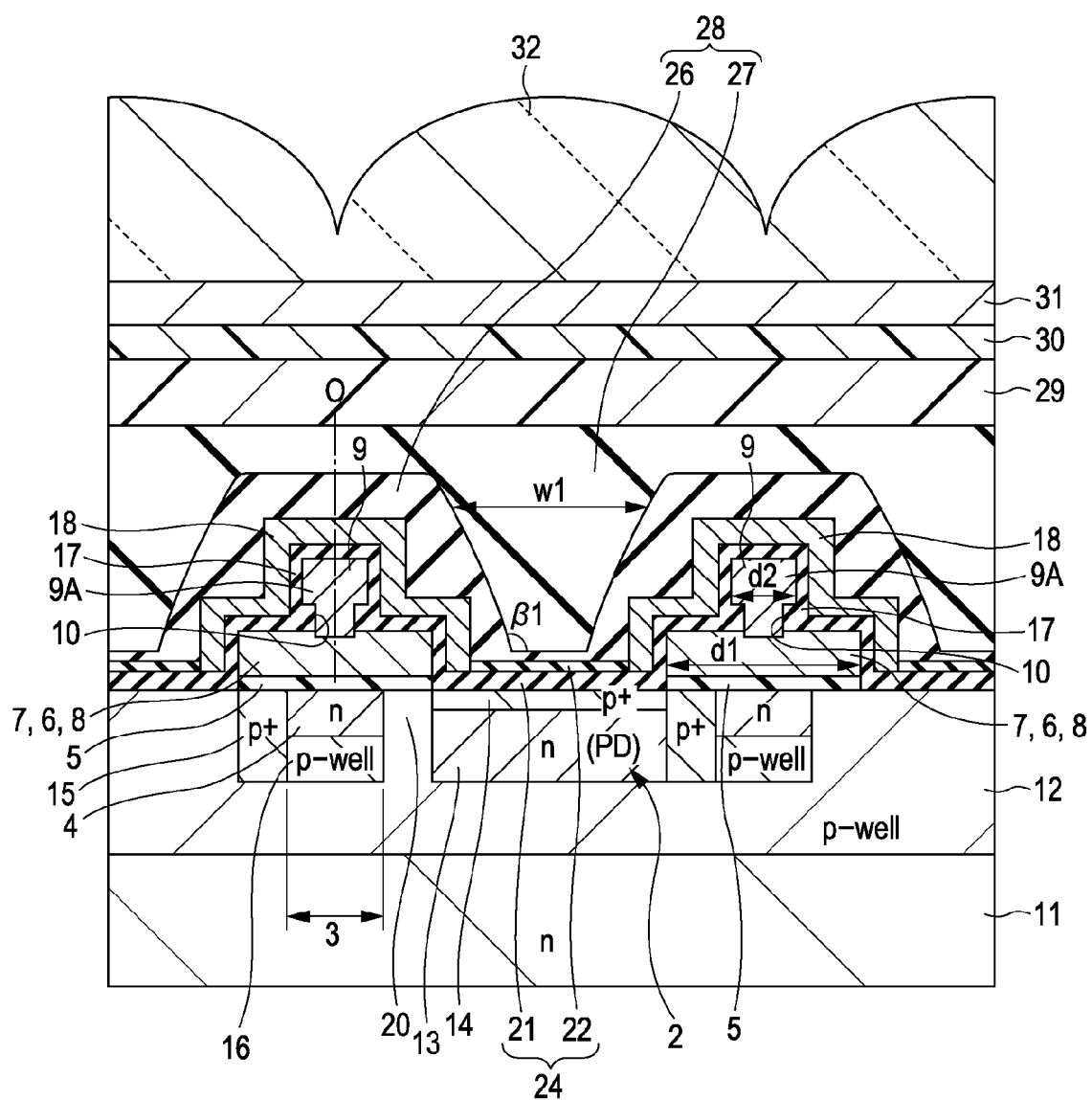
FIG. 22 is a schematic cross-sectional view showing a main portion of a solid-state imaging device according to a ninth embodiment of the present invention.

FIG. 22 shows an example of a solid-state imaging device according to a ninth embodiment of the present invention, which is applied to a CCD solid-state imaging device. In a solid-state imaging device 56 according to this embodiment, a cladding layer 26 of waveguides 28 is formed so as to follow the surface of the layered structure surrounding recesses. The cladding layer 26 has smooth inclinations unlike the example shown in FIG. 2 in which the cladding layer has slightly stepped portions. The cladding layer 6 and a core layer 27 constitute the waveguides 28. Since the other structures are the same as those in FIGS. 2 and 3, the detailed description thereof will be omitted. In FIG. 22, the same reference numerals are used to indicate components corresponding to those in FIG. 2.

In the solid-state imaging device 56 according to the ninth embodiment, since the basic structure is the same as that in the first embodiment, the same advantages as those of the first embodiment can be obtained.

10. Tenth Embodiment
(Example of Structure of Solid-state Imaging Device)

In a CCD solid-state imaging device according to a tenth embodiment (not shown), transfer electrodes in vertical transfer register sections are composed of a two-layer polysilicon film, and the waveguides according to any of the embodiments of the present invention are disposed on light-sensing sections. When transfer electrodes are formed using a two-layer polysilicon film, it is not necessary to use connecting conductive layers.

In the solid-state imaging device according to the tenth embodiment, as in the embodiments described above, the cross-sectional structure of the waveguide on the light-sensing section taken in the horizontal direction of the imaging plane is different from that in the vertical direction. Consequently, the phases of light totally reflected are not easily aligned, and standing waves are not easily generated. Therefore, the occurrence of spectral ripples is suppressed, and imaging characteristics can be improved.

11. Eleventh Embodiment
(Example of Structure of Solid-state Imaging Device)

Figure 23:
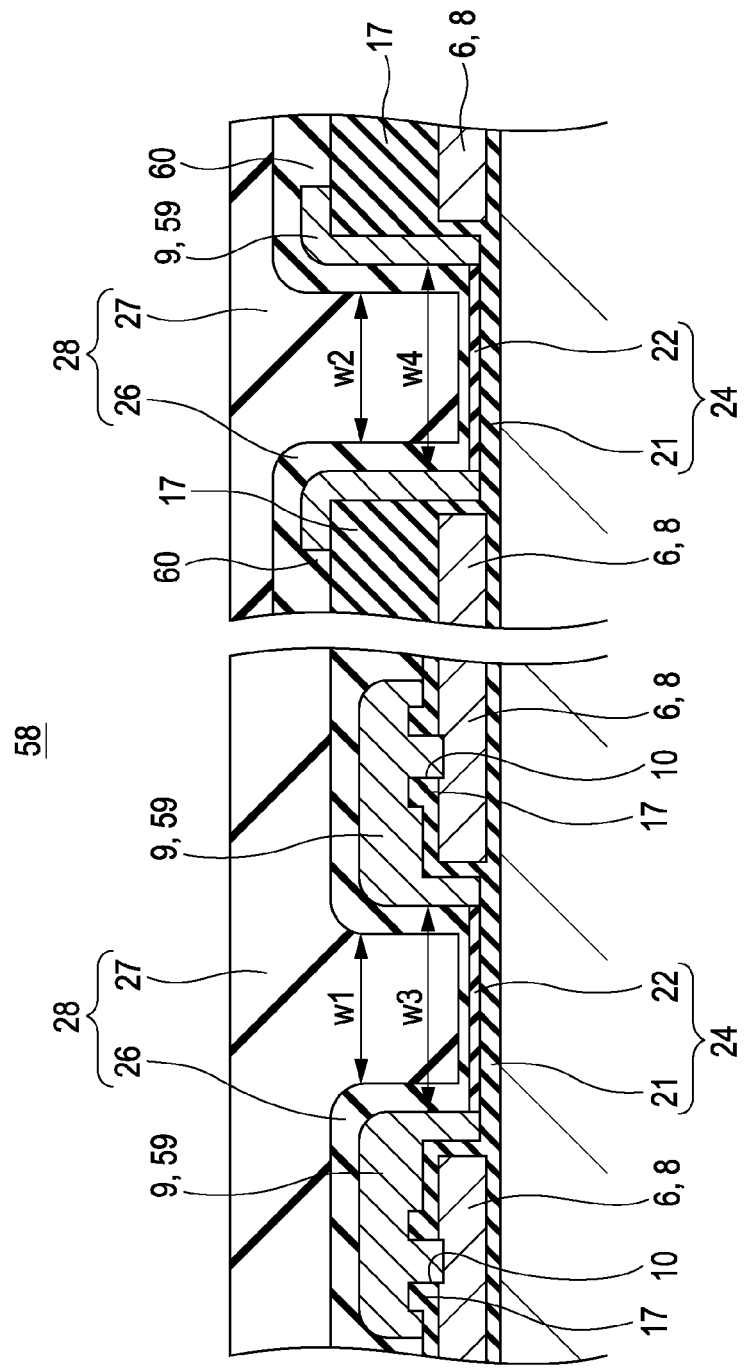
FIG. 23 includes schematic cross-sectional views showing a main portion of a solid-state imaging device according to an eleventh embodiment of the present invention (modification example)
Figure 24:
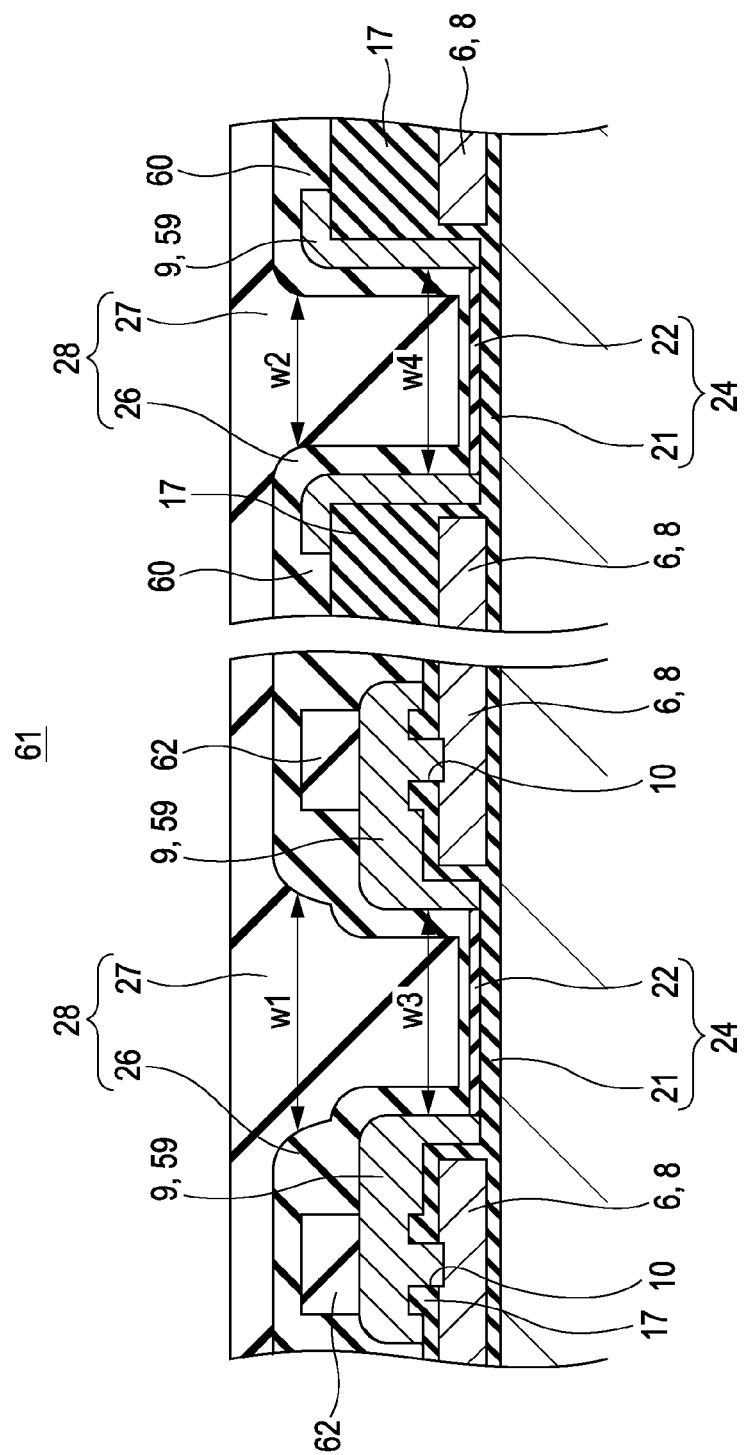
FIG. 24 includes schematic cross-sectional views showing a main portion of a solid-state imaging device according to the eleventh embodiment of the present invention (another modification example)
Figure 25:
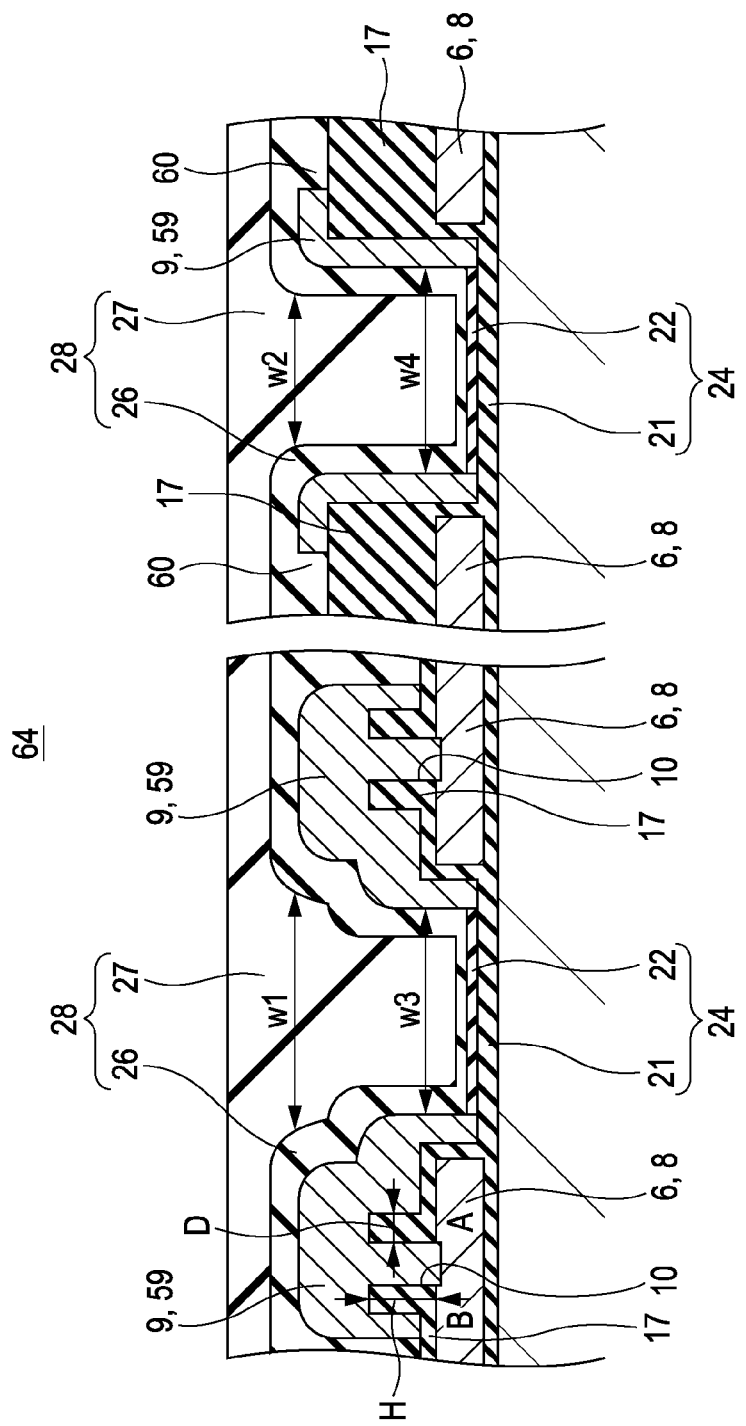
FIG. 25 includes schematic cross-sectional views showing a main portion of a solid-state imaging device according to the eleventh embodiment of the present invention (another modification example)

FIGS. 23 to 25 show modification examples of a solid-state imaging device according to an eleventh embodiment of the present invention, which is applied to a CCD solid-state imaging device. In the solid-state imaging devices according to the eleventh embodiment, connecting conductive layers also serve as light-shielding films.

In a solid-state imaging device 58 shown in FIG. 23, connecting conductive layers 9 connected to transfer electrodes 7 which are isolated like islands also serve as a light-shielding film 59 which cover transfer electrodes 6, 7, and 8 excluding light-sensing sections 2. The light-shielding film 59 has a lattice-like shape configured to surround light-sensing sections 2 in top plan view. An isolation trench 60 is disposed in the center of a portion extending horizontally between vertically adjacent light-sensing sections 2 such that connecting conductive layers 9 are separated for each horizontal line. Furthermore, by adjusting the thickness of an interlayer insulating film 17, the height of the waveguide 28 in the horizontal cross-section can be set different from that in the vertical cross-section. In this example, the height of the waveguide in the vertical cross-section is larger than the height of the waveguide in the horizontal cross-section. In this structure, the opening width w3 of the light-shielding film 59 in the horizontal direction of the imaging plane is different from the opening width w4 of the light-shielding film 59 in the vertical direction. A cladding layer 26 is formed so as to follow the surface of the layered structure including the light-shielding film 59 also serving as the connecting conductive layers 9. The cladding layer 26 and the core layer 27 constitute the waveguides 28. Since the other structures are the same as those of the first embodiment, the detailed description thereof will be omitted.

In the solid-state imaging device 58 according to this embodiment shown in FIG. 23, the opening width w3 of the light-shielding film 59 in the horizontal direction of the imaging plane is different from the opening width w4 of the light-shielding film 59 in the vertical direction. Because of such a structure, in the horizontal and vertical cross-sections, the core width w1 is different from the core width w2, at the same height from the surface of the silicon surface. As in the embodiments described above, the phases of light totally reflected are not easily aligned, and standing waves are not easily generated. Furthermore, since the height of the waveguide 28 in the horizontal cross-section is different from that in the vertical cross-section, three-dimensionally, symmetry of the core width is lost at a certain height, and standing waves are not easily generated. Consequently, the occurrence of spectral ripples is suppressed, and imaging characteristics can be improved.

In a solid-state imaging device 61 shown in FIG. 24, dummy patterns 62 having a predetermined width and height are formed on a light-shielding film 59 which also serves as connecting conductive layers 9 so as to correspond to transfer electrodes either in the cross-sectional structure taken in the horizontal direction of the imaging plane or in the cross-sectional structure taken in the vertical direction, the width of the dummy patterns 62 being smaller than the width of the light-shielding film 59. In this example, dummy patterns 62 are formed on the light-shielding film 59 in the horizontal cross-sectional structure. The dummy pattern 62 can be composed of, for example, an insulating film. A cladding layer 26 is formed so as to follow the surface of the layered structure including the dummy patterns 62, and the cladding layer 26 and a core layer 27 constitute waveguides 28. In this example, the height of the waveguide 28 in the horizontal cross-section is the same as that in the vertical cross-section. Since the other structures are the same as those of the embodiment shown in FIG. 23, the detailed description thereof will be omitted.

In the solid-state imaging device 61 according to the embodiment shown in FIG. 24, because of the presence of the dummy patterns 62, the difference between the core widths w1 and w2 at the same height from the surface of the substrate increases in the cross-section taken in the horizontal direction of the imaging plane and in the cross-section taken in the vertical direction. Thereby, as in the embodiments described above, the phases of light totally reflected are not easily aligned, and standing waves are not easily generated. Therefore, the occurrence of spectral ripples is suppressed, and imaging characteristics can be improved.

In a solid-state imaging device 64 shown in FIG. 25, at each of contact portions 10 between transfer electrodes 7 and connecting conductive layers 9 which also serve as a light-shielding film 59, the width D and the height H of the interlayer insulating film 17, in particular, the width D of a portion A and the height H of a portion B are varied. A cladding layer 26 is formed so as to follow the surface of the layered structure surrounding the openings, and the cladding layer 26 and a core layer 27 constitute waveguides 28. In this example, the height of the waveguide 28 in the horizontal cross-section is the same as that in the vertical cross-section. Since the other structures are the same as those of the embodiment shown in FIG. 23, the detailed description thereof will be omitted.

In the solid-state imaging device 64 according to the embodiment shown in FIG. 25, the core width w1 and the core width w2 are different at the same height from the surface of the substrate in the cross-section taken in the horizontal direction of the imaging plane and in cross-section taken in the vertical direction. Consequently, as in the embodiments described above, the phases of light totally reflected are not easily aligned, and standing waves are not easily generated. Therefore, the occurrence of spectral ripples is suppressed, and imaging characteristics can be improved.

12. Twelfth Embodiment (Example of Structure of Solid-state Imaging Device)

A solid-state imaging device according to an eleventh embodiment of the present invention (not shown) is applied to a CMOS solid-state imaging device. In a CMOS solid-state imaging device, photoelectric conversion elements serving as light-sensing sections, i.e., pixels, each including a photodiode and a plurality of pixel transistors, are two-dimensionally arrayed. A multilayer wiring layer including a plurality of wiring layers is disposed on a semiconductor substrate provided with a plurality of pixels with an interlayer insulating film therebetween, and an on-chip color filter and on-chip microlenses are further disposed thereon with a planarizing film therebetween. In this embodiment, recesses are formed in the interlayer insulating film of the multilayer wiring layer so as to correspond to the light-sensing sections, and waveguides according to any of the embodiments of the present invention described above are formed in the recesses.

In the CMOS solid-state imaging device according to the twelfth embodiment, the cross-sectional structure of the waveguide on the light-sensing section taken in the horizontal direction of the imaging plane is different from that taken in the vertical direction. Thereby, as in the embodiments described above, the phases of light totally reflected are not easily aligned, and standing waves are not easily generated. Therefore, the occurrence of spectral ripples is suppressed, and imaging characteristics can be improved.

As described above, the solid-state imaging devices according to the embodiments of the present invention are characterized by the structure of their waveguides. The structures of the waveguide are summarized as follows:

(1) A structure in which the core width of the waveguide in the horizontal direction of the imaging plane is different from the core width of the waveguide in the vertical direction of the imaging plane, at the same height in a waveguiding direction.

(2) A structure in which the inclination angle of the interface between the core layer and the cladding layer in the cross-sectional structure of the waveguide taken in the horizontal direction is different from that in the cross-sectional structure of the waveguide taken in the vertical direction.

(3) A structure of a waveguide satisfying the requirement (1) or (2) described above, or a structure of a waveguide satisfying both requirements (1) and (2).

The embodiments of the present invention are also applicable to the case where the direction of the pixel arrangement period does not correspond to the horizontal/vertical direction of the imaging plane. That is, the embodiments of the present invention are also applicable to the structure in which the shape of the waveguide in a cross-section taken in the pixel arrangement direction is different from the shape of the waveguide in a cross-section taken in a direction orthogonal to the pixel arrangement direction.

13. Thirteenth Embodiment (Example of Structure of Electronic Apparatus)

Solid-state imaging devices according to any of the embodiments of the present invention can be applied to electronic apparatuses, such as cameras provided with solid-state imaging devices, camera-equipped mobile apparatuses, and other apparatuses provided with solid-state imaging devices.

Figure 26:
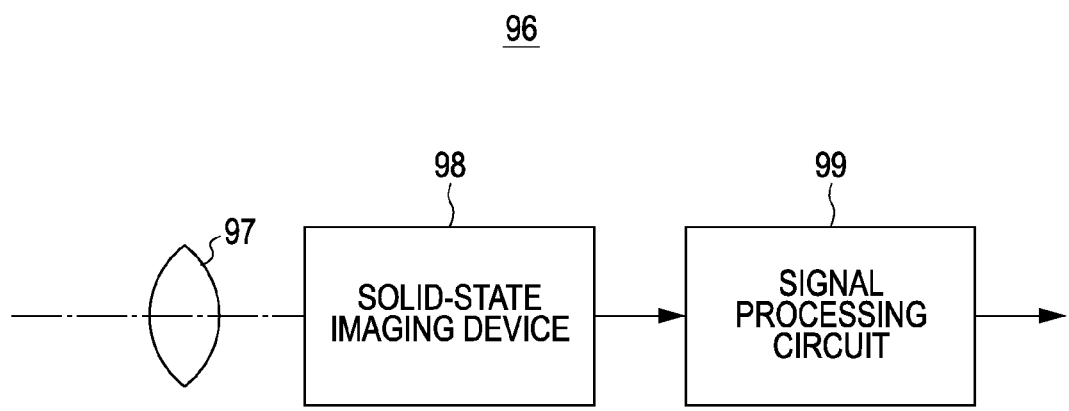
FIG. 26 is a schematic diagram showing an electronic apparatus according to an embodiment of the present invention.
Figure 27:
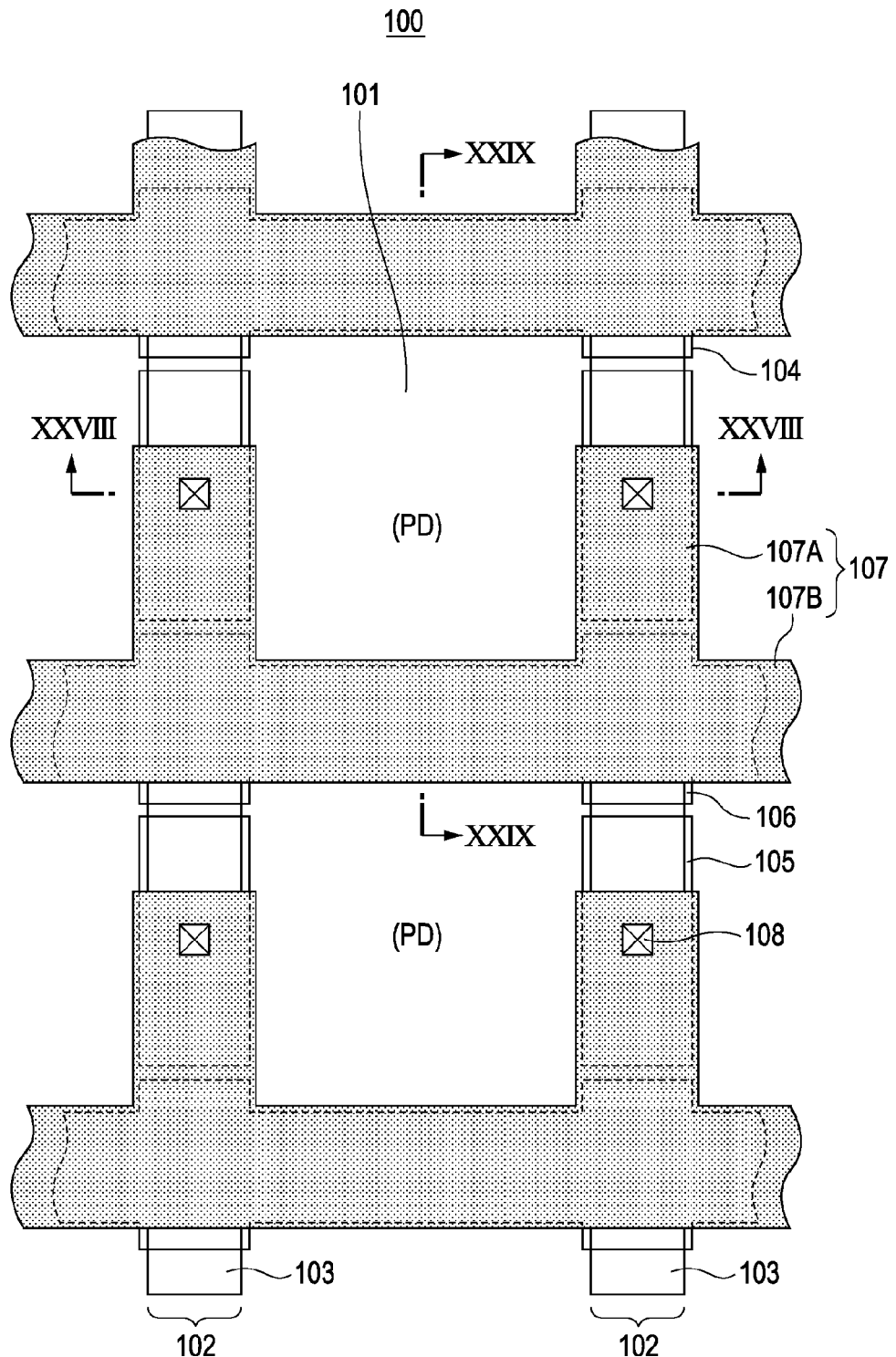
FIG. 27 is a schematic plan view of a main portion of a solid-state imaging device according to the related art.
Figure 28:
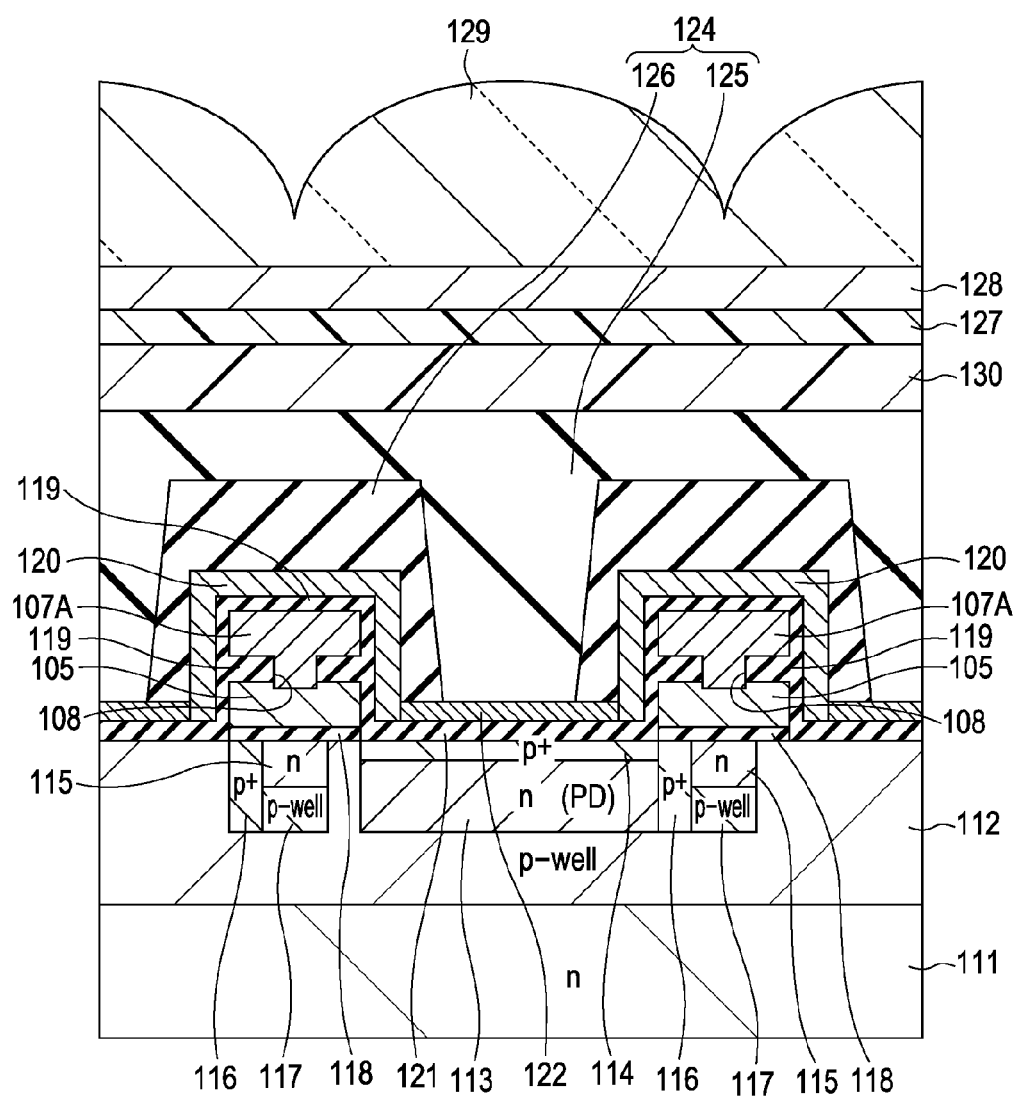
FIG. 28 is a cross-sectional view taken along the line XXVIII-XXVIII of FIG. 27.
Figure 29:
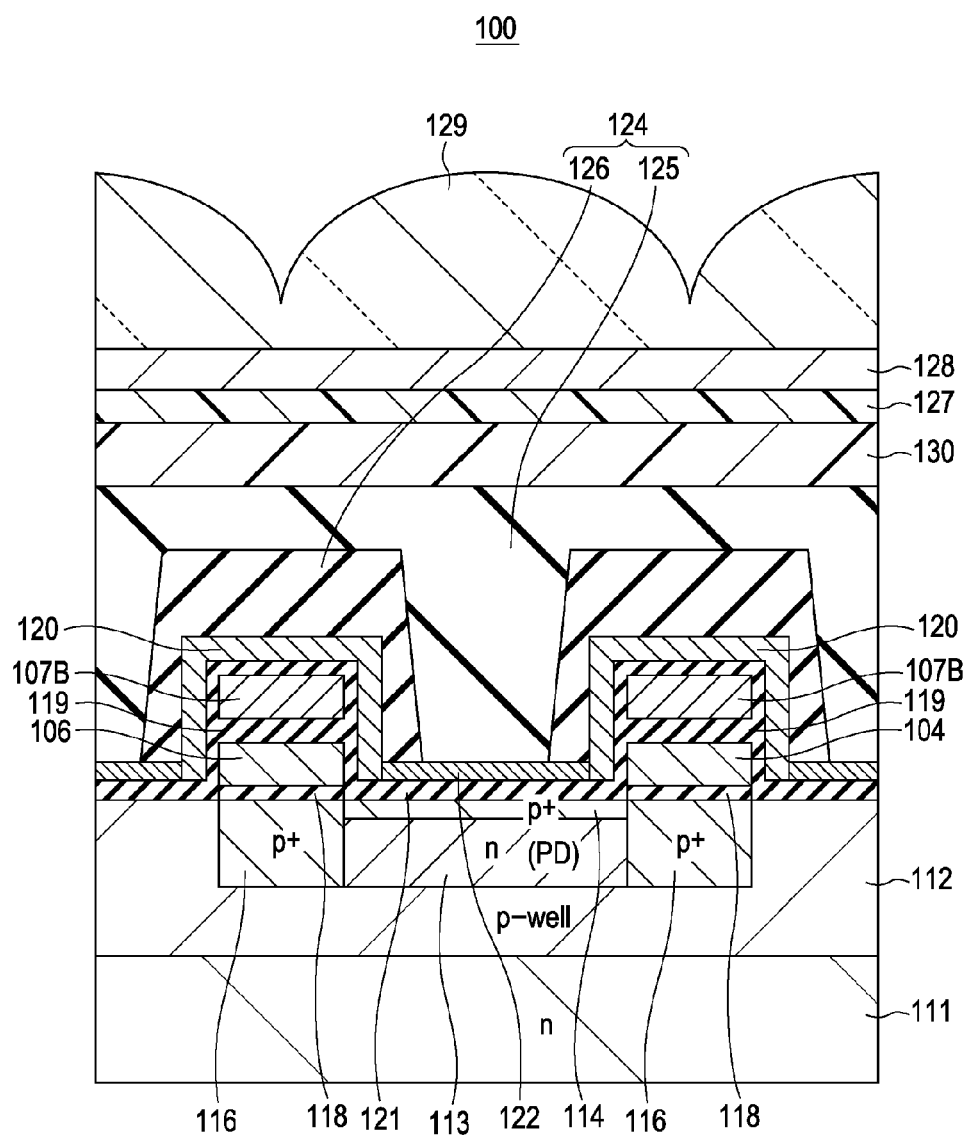
FIG. 29 is a cross-sectional view taken along the line XXIX-XXIX of FIG. 27.
Figure 30:
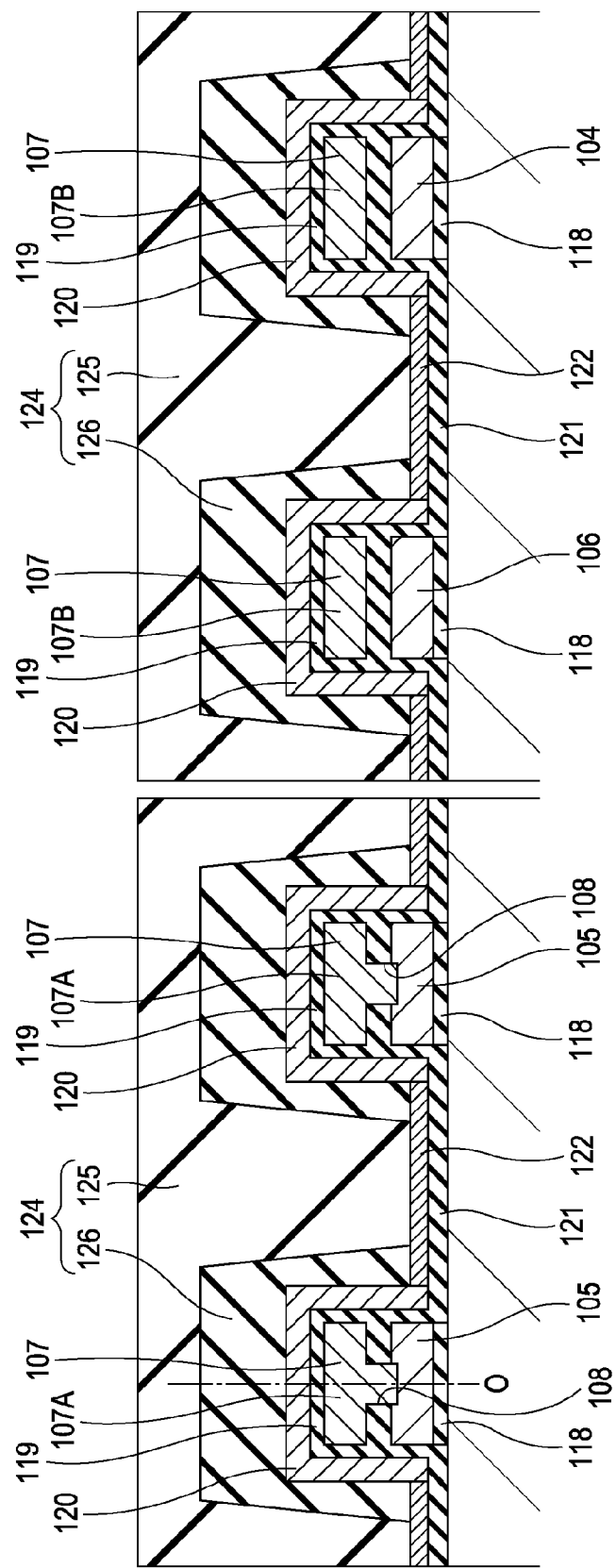
FIG. 30 includes cross-sectional views showing an example of the electrode structure of a solid-state imaging device.
Figure 31:
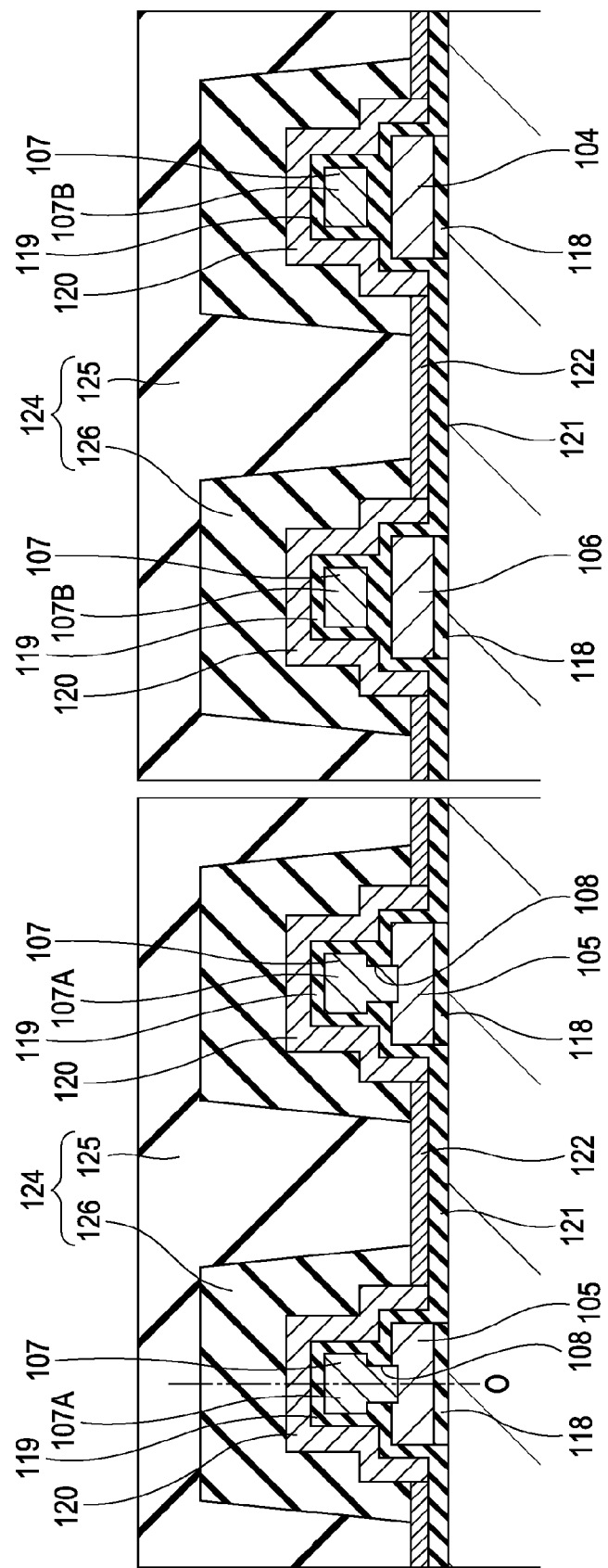
FIG. 31 includes a cross-sectional views showing another example of the electrode structure of a solid-state imaging device.
Figure 32A:
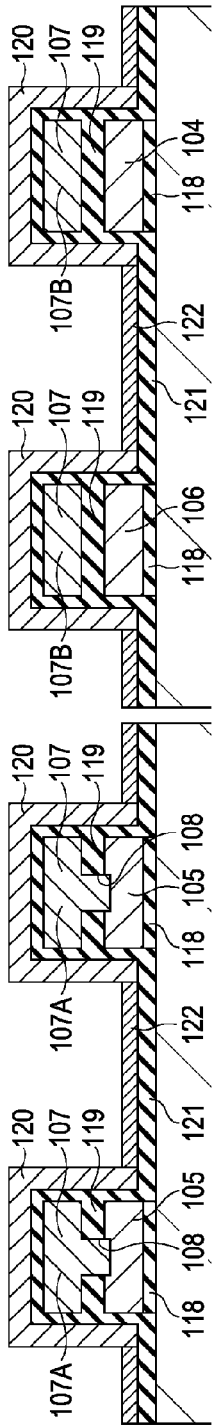
FIGS. 32A to 32C show steps in a method of manufacturing a solid-state imaging device according to the related art.
Figure 32B:
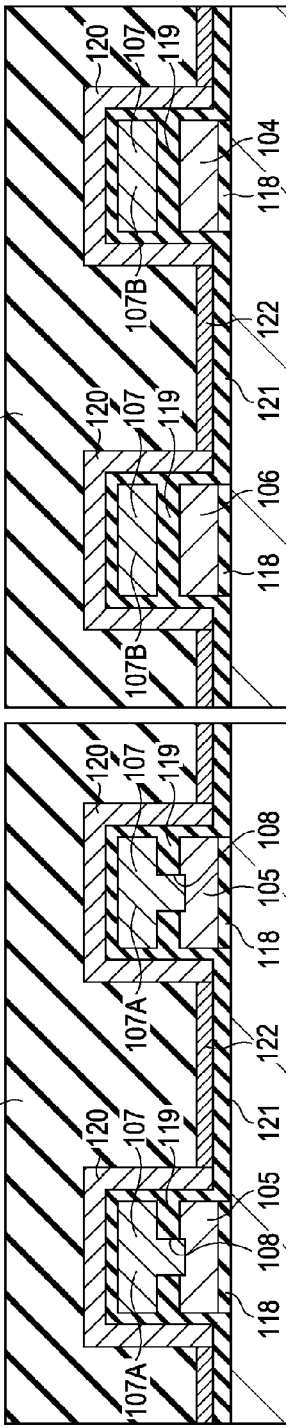
Figure 32C:
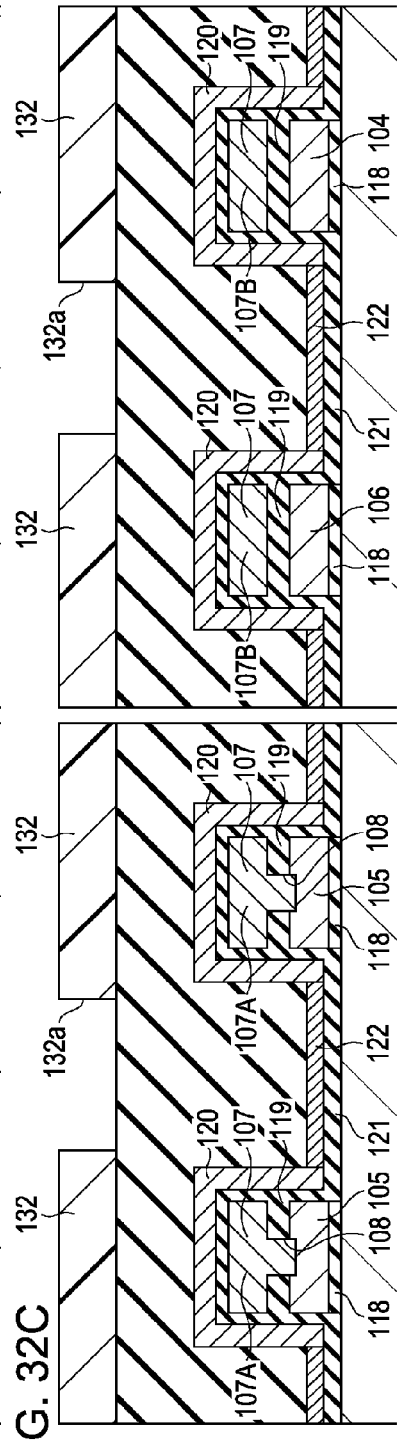
Figure 35:
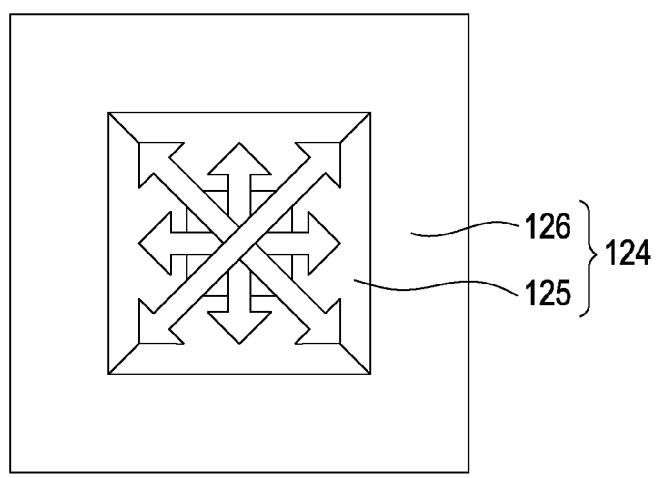
FIG. 35 is a plan view of a waveguide used for describing the example according to the related art.
Figure 36:
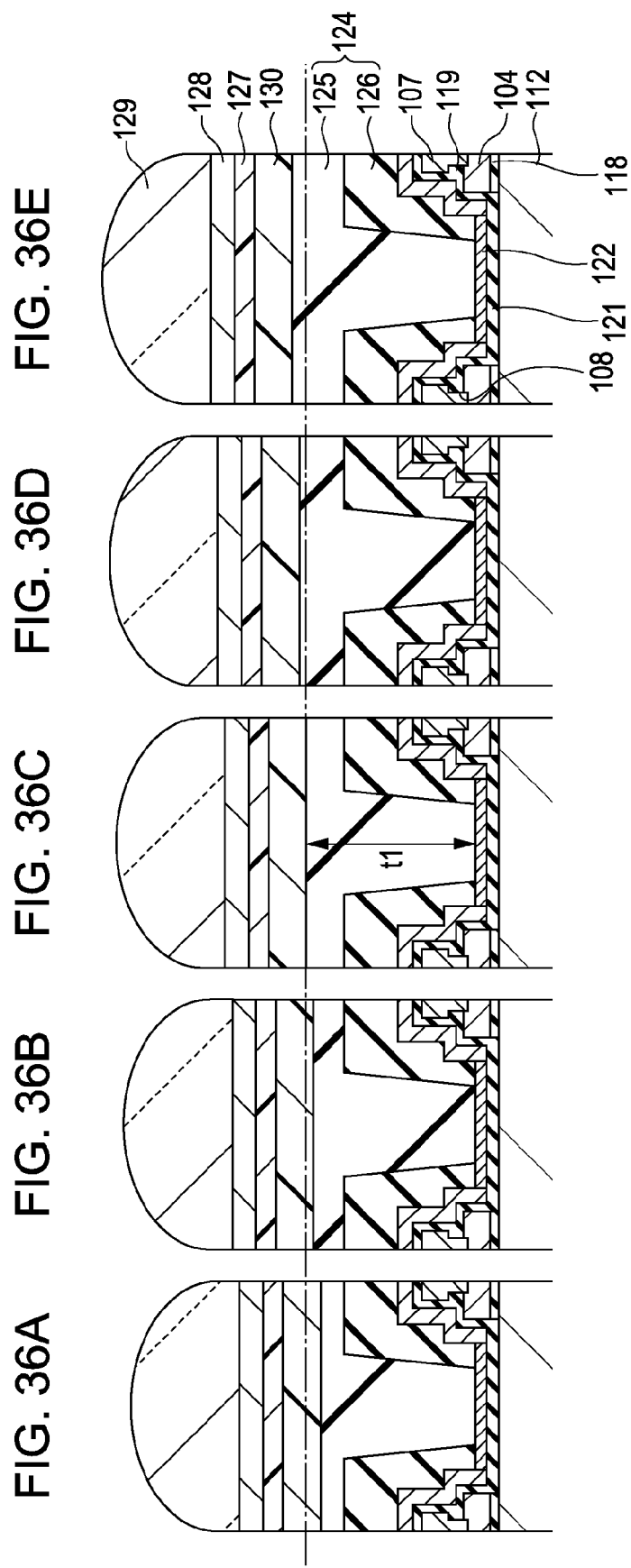
FIGS. 36A to 36E show samples for measuring spectral characteristics of solid-state imaging devices according to the related art.

FIG. 26 shows an electronic apparatus according to an embodiment of the present invention, in which a solid-state imaging device is applied to a camera. A camera 96 according to this embodiment includes an optical system (optical lens) 97, a solid-state imaging device 98, and a signal processing circuit 99. As the solid-state imaging device 98, a solid-state imaging device according to any one of the embodiments described above is used. The optical system 97 focuses an image light from an object (incident light) onto an imaging plane of the solid-state imaging device. Thereby, signal charges are accumulated for a certain period in photoelectric conversion elements of the solid-state imaging device 98. The signal processing circuit 99 performs various signal processings on output signals of the solid-state imaging device 98 and then outputs the signals. The camera 96 according to this embodiment may be in the form of a camera module in which the optical system 97, the solid-state imaging device 98, and the signal processing circuit 99 are formed into a module.

According to the embodiment of the present invention, it is possible to configure a camera-equipped mobile apparatus, typified by a mobile phone, provided with the camera 26 shown in FIG. 26 or a camera module.

Furthermore, the structure shown in FIG. 26 can be configured as a module having an imaging function in which the optical system 97, the solid-state imaging device 98, and the signal processing circuit 99 are formed into a module, i.e., an image-forming module. According to the embodiment of the present invention, it is possible to configure an electronic apparatus provided with such an image-forming module.

In the electronic apparatus according to this embodiment, the imaging characteristics in the solid-state imaging device are improved, and high-definition images can be obtained. Thus, it is possible to provide a high-quality electronic apparatus.

The present application contains subject matter related to that disclosed in Japanese Priority Patent Application JP 2008-251669 filed in the Japan Patent Office on Sep. 29, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:

light-sensing sections serving as pixels;

waveguides each including a core layer and a cladding layer, each of the waveguides being disposed at a position corresponding to one of the light-sensing sections;

a vertical transfer register section disposed for each column of light-sensing sections;

transfer electrodes composed of first-layer polysilicon disposed in the vertical transfer register section; and connecting conductive layers composed of second-layer polysilicon, the connecting conductive layers being connected to predetermined transfer electrodes among the transfer electrodes;

wherein, the transfer electrodes other than the predetermined transfer electrodes and portions of the connecting conductive layers lying as an upper layer extend between the vertically adjacent pixels, a cross-sectional structure including the transfer electrodes and the connecting conductive layers in the vertical transfer register section is different from a cross-sectional structure including the transfer electrodes and the connecting conductive layers extending between the vertically adjacent pixels, and a cross-sectional structure of the waveguide taken in a direction parallel to a direction of pixel arrangement period is different from a cross-sectional structure of the waveguide taken in a direction orthogonal to the direction of pixel arrangement period with pixel arrangements being different in a horizontal direction of an imaging plane and in a vertical direction of the imaging plane.

2. The solid-state imaging device according to claim 1, wherein:

a width of the core layer in the waveguide in the horizontal direction of the imaging plane is different than a width of the core layer in the waveguide in the vertical direction of the imaging plane, at the same height from a surface of a substrate, the light sensing sections are rectangularly shaped, and the light-sensing sections having openings that are wider in a longitudinal direction than in a lateral direction.

3. The solid-state imaging device according to claim 2, wherein an inclination angle in a waveguiding direction of the interface between the core layer and the cladding layer in the waveguide in the horizontal direction of the imaging plane is different from an inclination angle in the waveguiding direction of the interface between the core layer and the cladding layer in the waveguide in the vertical direction of the imaging plane.

4. The solid-state imaging device according to claim 3, wherein the inclination angle in either one or each of the horizontal direction and the vertical direction is symmetrical or asymmetrical with respect to the axis in the waveguiding direction.

5. The solid-state imaging device according to claim 1, wherein an inclination angle in a waveguiding direction of the interface between the core layer and the cladding layer in the waveguide in the horizontal direction of the imaging plane is different from an inclination angle in the waveguiding direction of the interface between the core layer and the cladding layer in the waveguide in the vertical direction of the imaging plane.

6. The solid-state imaging device according to claim 5, wherein the inclination angle in either one or each of the horizontal direction and the vertical direction is symmetrical or asymmetrical with respect to the axis in the waveguiding direction.

7. The solid-state imaging device according to claim 1, wherein:

an intermediate layer is disposed between the core layer and the cladding layer, the intermediate layer having a different refractive index from the core layer, a refractive index of the core layer is 1.60 to 2.20, a refractive index of the cladding layer is 1.00 to 1.59, and the cladding layer has a predetermined thickness on the laminated insulating film.

8. A method of manufacturing a solid-state imaging device, comprising the steps of:

forming a layered structure which includes forming transfer electrodes composed of first-layer polysilicon disposed in vertical transfer register sections and connecting conductive layers composed of a second-layer polysilicon, the connecting conductive layers being connected to predetermined transfer electrodes among the transfer electrodes, the transfer electrodes other than the predetermined transfer electrodes and portions of the connecting conductive layers lying as an upper layer extending between vertically adjacent pixels, a cross-sectional structure including the transfer electrodes and the connecting conductive layers in the vertical transfer register section being different from a cross-sectional structure including the transfer electrodes and the connecting conductive layers extending between the vertically adjacent pixels;

forming a cladding layer so as to follow a layered structure, the layered structure being formed such that a cross-sectional shape of each of openings corresponding to light-sensing sections in the horizontal direction of an imaging plane is different from a cross-sectional shape of each of the openings corresponding to the light-sensing sections in the vertical direction of the imaging plane;

shaping the cladding layer; and embedding a core layer in the openings corresponding to the light-sensing sections.

9. The method of manufacturing a solid-state imaging device according to claim 8, further comprising the step of forming the layered structure which includes forming transfer electrodes composed of first-layer polysilicon disposed in vertical transfer register sections and connecting conductive layers composed of second-layer polysilicon, the connecting conductive layers being connected to predetermined transfer electrodes among the transfer electrodes, wherein, the transfer electrodes other than the predetermined transfer electrodes and portions of the connecting conductive layers lying as an upper layer extend between the vertically adjacent pixels, a cross-sectional structure including the transfer electrodes and the connecting conductive layers in the vertical transfer register section is different from a cross-sectional structure including the transfer electrodes and the connecting conductive layers extending between the vertically adjacent pixels.

10. The method of manufacturing a solid-state imaging device according to claim 9, wherein:

the transfer electrodes and the connecting conductive layers extending between the vertically adjacent pixels are formed with the same width, and the connecting conductive layers in the vertical transfer register sections are formed with a smaller width than the width of the transfer electrodes located therebelow.

11. The method of manufacturing a solid-state imaging device according to claim 9, wherein either one or each of a cross-sectional structure including the transfer electrodes and the connecting conductive layers in the vertical transfer register section and a cross-sectional structure including the transfer electrodes and the connecting conductive layers extending between the vertically adjacent pixels is formed asymmetrically with respect to an axis.

12. The method of manufacturing a solid-state imaging device according to any one of claims 8 to 11, further comprising the step of:

forming an intermediate layer between the core layer and the cladding layer, the intermediate layer having a different refractive index from the core layer;

forming light-sensing sections serving as pixels in a rectangular shape, providing openings in the light-sensing sections that are wider in a longitudinal direction than an opening of the light-sensing sections in a lateral direction; and disposing, on surfaces of the light-sensing sections, a laminated insulating film formed of a plurality of films.

13. An electronic apparatus comprising:
a solid-state imaging device;
an optical system which guides incident light to photoelectric conversion elements of the solid-state imaging device; and
a signal processing circuit which processes output signals of the solid-state imaging device;
wherein the solid-state imaging device includes:
(a) light-sensing sections serving as pixels,
(b) waveguides, each of the waveguides including a core layer and a cladding layer, each of the waveguides being disposed at a position corresponding to one of the light-sensing sections, in which a cross-sectional structure of the waveguide taken in a horizontal direction of an imaging plane is different from a cross-sectional structure of the waveguide taken in a vertical direction of the imaging plane,
(c) a vertical transfer register section disposed for each column of light-sensing sections;
(d) transfer electrodes composed of first-layer polysilicon disposed in the vertical transfer register section; and
(e) connecting conductive layers composed of second-layer polysilicon, the connecting conductive layers being connected to predetermined transfer electrodes among the transfer electrodes;
wherein,
the transfer electrodes other than the predetermined transfer electrodes and portions of the connecting conductive layers lying as an upper layer extend between the vertically adjacent pixels, and
a cross-sectional structure including the transfer electrodes and the connecting conductive layers in the vertical transfer register section is different from a cross-sectional structure including the transfer electrodes and the connecting conductive layers extending between the vertically adjacent pixels.

14. The electronic apparatus according to claim 13, wherein, in the solid-state imaging device:
a width of the core layer in the waveguide in the horizontal direction of the imaging plane is different from a width of the core layer in the waveguide in the vertical direction of the imaging plane, at the same height from a surface of a substrate,
the light-sensing sections are rectangularly shaped, and
the light-sensing sections have openings that are wider in a longitudinal direction than in a lateral direction.

15. The electronic apparatus according to claim 13 further comprising a laminated insulating film, including a plurality of films, disposed on surfaces of the light-sensing sections and configured with an antireflection property.

* * * * *